United States Patent
Zhu et al.

(10) Patent No.: US 11,179,822 B2
(45) Date of Patent: Nov. 23, 2021

(54) POLYURETHANE POLISHING LAYER, POLISHING PAD COMPRISING POLISHING LAYER, METHOD FOR PREPARING POLISHING LAYER AND METHOD FOR PLANARIZING MATERIAL

(71) Applicant: HUBEI DINGHUI MICROELECTRONICS MATERIALS CO., LTD, Hubei (CN)

(72) Inventors: Shunquan Zhu, Wuhan (CN); Yijie Luo, Wuhan (CN); Min Liu, Wuhan (CN); Jiping Zhang, Wuhan (CN); Liyuan Che, Wuhan (CN)

(73) Assignee: HUBEI DINGHUI MICROELECTRONICS MATERIALS CO., LTD, Hubei (CN)

( * ) Notice: Subject to any disclaimer, the term of this patent is extended or adjusted under 35 U.S.C. 154(b) by 0 days.

(21) Appl. No.: 16/642,008

(22) PCT Filed: Aug. 31, 2018

(86) PCT No.: PCT/CN2018/103619
§ 371 (c)(1),
(2) Date: Feb. 25, 2020

(87) PCT Pub. No.: WO2019/042428
PCT Pub. Date: Mar. 7, 2019

(65) Prior Publication Data
US 2020/0215661 A1 Jul. 9, 2020

(30) Foreign Application Priority Data

Aug. 31, 2017 (CN) .......................... 201710769743.9
Mar. 6, 2018 (CN) .......................... 201810182728.9

(51) Int. Cl.
*B24B 37/24* (2012.01)
*C08G 18/10* (2006.01)
(Continued)

(52) U.S. Cl.
CPC .............. *B24B 37/24* (2013.01); *C08G 18/10* (2013.01); *C08G 18/4854* (2013.01);
(Continued)

(58) Field of Classification Search
CPC ...................... B24B 37/20–26; C08G 18/5024
See application file for complete search history.

(56) References Cited

U.S. PATENT DOCUMENTS 6,477,926 B1 * 11/2002 Swisher ................. B24B 37/24
451/526
7,169,030 B1 1/2007 Kulp
(Continued)

FOREIGN PATENT DOCUMENTS

CN 1914241 A 2/2007
CN 1915596 A 2/2007
(Continued)

OTHER PUBLICATIONS

Bartyczak et al. Mitigating Blast and Shock With Advanced Materials. NSWCDD/TR-17/463. (Year: 2018).*
(Continued)

*Primary Examiner* — Michael M Dollinger
(74) *Attorney, Agent, or Firm* — Pattao, LLC; Junjie Feng

(57) ABSTRACT

A polishing pad, a polyurethane polishing layer and a preparation method thereof are provided, belonging to the technical field of polishing in chemical-mechanical planarization treatment. The polyurethane polishing layer having a coefficient of thermal expansion of 100-200 ppm/° C. comprises a reaction product produced by reacting of multiple components. The multiple components include an isocya-
(Continued)

nate-terminated prepolymer, a hollow microsphere polymer and a curing agent composition. The curing agent composition includes 5-55 wt % of an aliphatic diamine composition, 0-8 wt % of a polyamine composition and 40-90 wt % of an aromatic bifunctional composition. The polyurethane polishing layer has a density of 0.6-1.1 g/cm$^3$, a Shore hardness of 45-70D and an elongation at break of 50-450%. The polyurethane polishing layer is prepared by a simple process with low cost and energy consumption. The polyurethane polishing layer prepared by the process has a high hydrolytic stability, a uniform density and a stable removal rate.

15 Claims, 9 Drawing Sheets

(51) Int. Cl.
 C08G 18/48 (2006.01)
 C08G 18/50 (2006.01)
 C08G 18/76 (2006.01)
 C09G 1/16 (2006.01)
 H01L 21/306 (2006.01)

(52) U.S. Cl.
 CPC ..... *C08G 18/5024* (2013.01); *C08G 18/7621* (2013.01); *C09G 1/16* (2013.01); *H01L 21/30625* (2013.01)

(56) References Cited

U.S. PATENT DOCUMENTS

| | | |
|---|---|---|
| 7,414,080 B2 | 8/2008 | Kulp |
| 8,288,448 B2 | 10/2012 | Kulp |
| 9,144,880 B2 | 9/2015 | Qian et al. |
| 2003/0217517 A1* | 11/2003 | Allison ............ B24D 3/32 51/298 |
| 2004/0166779 A1* | 8/2004 | Balijepalli ........ B24B 37/245 451/41 |
| 2005/0171224 A1 | 8/2005 | Kulp |
| 2005/0171225 A1 | 8/2005 | Kulp |
| 2006/0089093 A1* | 4/2006 | Swisher ............ C08L 75/02 451/526 |
| 2006/0089094 A1* | 4/2006 | Swisher ............. B32B 5/20 451/527 |
| 2006/0089095 A1* | 4/2006 | Swisher ........... B24B 37/205 451/533 |
| 2006/0276109 A1* | 12/2006 | Roy ............... B24B 49/02 451/41 |
| 2007/0042682 A1* | 2/2007 | Saikin ........... B24B 37/205 451/6 |
| 2008/0242755 A1 | 10/2008 | Kulp |
| 2011/0054057 A9 | 3/2011 | Kulp |
| 2012/0283153 A1* | 11/2012 | McDaniel ........ C09K 8/805 507/219 |
| 2013/0075362 A1* | 3/2013 | Lakrout .......... B24B 37/26 216/48 |
| 2013/0084702 A1* | 4/2013 | Xie .............. C08G 18/4825 438/692 |
| 2014/0120809 A1 | 5/2014 | Qian et al. |
| 2014/0357170 A1* | 12/2014 | Qian ............ B24B 37/205 451/527 |
| 2015/0065014 A1* | 3/2015 | Jensen ........... B24B 37/205 451/41 |
| 2015/0065020 A1* | 3/2015 | Roy .............. B24D 11/04 451/529 |
| 2015/0174726 A1* | 6/2015 | Litke ........... C08G 18/222 451/59 |
| 2016/0136787 A1 | 5/2016 | Bajaj et al. |

FOREIGN PATENT DOCUMENTS

| | | |
|---|---|---|
| CN | 101077569 A | 11/2007 |
| CN | 102702946 A | 10/2012 |
| CN | 103802018 A | 5/2014 |
| CN | 103878707 A | 6/2014 |
| CN | 104209853 A | 12/2014 |
| CN | 105038546 A | 11/2015 |
| CN | 105904352 A | 8/2016 |
| CN | 106046313 A | 10/2016 |
| CN | 106891246 A | 6/2017 |
| CN | 107553313 A | 1/2018 |
| JP | 2016196058 A | 11/2016 |

OTHER PUBLICATIONS

Moinpour et al. MRS Bulletin/Oct. 2002. Advances in Characterization of CMP Consumables, www.mrs.org/publications/bulletin. (Year: 2002).*
Vibrathane General Processing Information (Year: 2021).*
International Search Report in the international application No. PCT/CN2018/103619, dated Nov. 1, 2018.
English translation of the Written Opinion of the International Search Authority in the international application No. PCT/CN2018/103619, dated Nov. 1, 2018.

* cited by examiner

Example 21      Example 22

Example 23      Comparative Example 3

POLYURETHANE POLISHING LAYER, POLISHING PAD COMPRISING POLISHING LAYER, METHOD FOR PREPARING POLISHING LAYER AND METHOD FOR PLANARIZING MATERIAL

TECHNICAL FIELD

The disclosure relates to the polishing technical field of chemical-mechanical planarization treatment, and in particular to a polyurethane polishing layer and a method for preparing the same, a polishing pad comprising the polyurethane polishing layer and a method for planarizing a material by using the polishing pad.

BACKGROUND

In a preparation process of a semiconductor device, along with upgrade of a manufacture technology, a size between a lead wire and a grid is reduced continuously. For a photolithography, a demand for a flatness degree of a wafer surface is increasingly higher. Since 1991 when a Chemical-Mechanical Polishing (CMP) technology was successfully applied to producing a 64 Mb Dynamic Random Access Memory (DRAM) by IBM, the CMP technology has gained a rapid development. At present, the CMP technology has been widely applied in planarization of a semiconductor wafer, a memory disk and a high-precision optical material. The CMP is also referred to as chemical-mechanical polishing, which is a technology combining chemical corrosion and mechanical removal and which is the only technology capable of implementing surface global planarization in machining at present. A conventional CMP process is as follows: a to-be-machined material is fixed on a carrier, and pressed to a polishing pad fixed on a machine table under a certain pressure with a to-be-polished surface downwards; and by virtue of relative rotation between the to-be-machined material and the polishing pad, the material on a surface of a workpiece is removed by mechanical cutting of abrasive particles and chemical corrosion of an oxidant in presence of a polishing solution, and thus a bright and clean surface is obtained.

With a process in which a characteristic size of an integrated circuit is developed to deep nano manufacture, a dielectric material with higher requirements is needed by a manufacturing process. In order to suppress the interconnection delay caused by the increase of crosstalk between metal wires, more and more dielectric materials having a low κ or even an ultra-low κ are applied therein. However, the dielectric materials having the low κ and the ultra-low κ are generally obtained by improving a porosity of the material. Compared with a conventional dielectric material, the dielectric material having the low κ or the ultra-low κ tends to have a lower mechanical strength and a poor adhesive force, so that the planarization thereof is more difficult.

In addition, with the reduction of the characteristic size, a defect such as scratching caused by the CMP process has been a bigger problem. Therefore, for an advanced manufacturing process, for example, a process in which the characteristic size is 28 nm or below, the polishing pad is required to have a lower defect, a fewer scratches, and a better removal rate to the material having the low κ or the ultra-low κ. Additionally, in the advanced manufacturing process in which the characteristic size is 28 nm or below, the requirement for the uniformity of the polishing pad is higher. The striation caused by nonuniformly mixing or heat releasing in a casting process is controlled more strictly, and it is required that an obvious striation line cannot be seen on a strong light table.

A polyurethane polishing pad is a type of polishing pad applied most widely in the high-precision polishing field, and can be applied for preparing a polished silicon wafer, a patterned wafer, a flat panel displayer and a disk memory because of a good wear resistance, an extremely high tearing strength, and a moderate resistance to acid or alkali. It is known that the defects such as scratching can be effectively reduced by using the polyurethane having a low hardness in the polishing process. However, the removal rate is reduced correspondingly. During developing the polishing pad, an important topic needing to be focused on is how to achieve an ideal balance between the scratching and the removal rate.

On the other hand, for the manufacture of the polishing layer, the following method has been proved to be an effective method for manufacturing a polishing pad with stable and reproducible polishing properties: casting the polyurethane into a block, and then cutting the block into sheets with a certain thickness. But unfortunately, the polyurethane polishing layers manufactured with the casting-cutting method may produce more or less discrepancies during polishing because the polishing layers are from different casting positions.

For example, the polishing pad cut from a bottom casting position of the blocky polyurethane and the polishing pad cut from a top casting position have different densities and porosities. Generally, the density of the polishing pad cut from the bottom is greater than that from the top, and the porosity has an opposite result. Additionally, for a same polishing pad, it has different density distributions from a center to an edge. The closer to a central position, the smaller the density; and the closer to the edge, the larger the density. These differences have a negative impact on the applications which have higher requirements, for example, the wafer having a pattern of a low k material.

Therefore, there is a need for further improving a multi-component curing agent system, in order to provide a polishing pad which may be reproducibly manufactured and have a uniform quality and a balanced property, thereby meeting the requirements of the advanced manufacturing process.

SUMMARY

In view of this, a main objective of the disclosure is to solve at least one of the above-mentioned problems.

To this end, a first objective of the disclosure is to provide a polyurethane polishing layer having a uniform quality, as well as good hardness, elongation at break, hydrolytic stability and coefficient of thermal expansion and a preparation method thereof, and a polishing pad including the polyurethane polishing layer of the disclosure.

To at least achieve the first objective, a first aspect of the disclosure provides a polyurethane polishing layer. The polishing layer of the disclosure is prepared by using a multi-component (such as two components and three components) curing agent system having a low melting point and use temperature. In the multi-component (such as two components and three components) curing agent system having the low melting point and use temperature, the viscosity and melting point of the whole curing agent system are adjusted via an aliphatic diamine compound having a low melting point, so that a curing reaction may be carried out at a low temperature (for example, an initial reaction temperature is lower than 70° C.). As such, a phenomenon of locally overheating in the polyurethane castable, which is caused by that the heat of the curing reaction cannot be rapidly released, is effectively avoided. The qualities of the polishing layers obtained by cutting the casting block do not vary with the cutting positions, such that the polyurethane polishing layers with uniform quality and particularly with uniform density are obtained. Therefore, the polyurethane polishing layer of the disclosure has a relatively uniform density, so that an edge effect is suppressed, and removal rates for an edge portion and a central portion during polishing work are closer. In addition, an appropriate curing agent system is obtained by selecting appropriate curing agents and amounts thereof, such that a polishing layer with good hardness, elongation at break, hydrolytic stability and coefficient of thermal expansion is obtained.

In view of this, the disclosure provides a polyurethane polishing layer. The polyurethane polishing layer is a reaction product of a raw material combination. The raw material combination includes an isocyanate-terminated prepolymer, a hollow microsphere polymer and a curing agent composition.

Based on a total weight of the curing agent composition, the curing agent composition includes:

5-55 wt % of an aliphatic diamine curing agent, in which a number-average molecular weight of the aliphatic diamine is 1000-5000;

0-8 wt % of a polyamine curing agent, in which a molecular structure of the polyamine curing agent at least comprises three primary amine groups or at least comprises three secondary amine groups, and a number-average molecular weight of the polyamine curing agent is 250-6000; and 40-90 wt % of an aromatic bifunctional curing agent.

The polyurethane polishing layer has a density of 0.6-1.1 g/cm$^3$, a Shore hardness of 45-70 and an elongation at break of 50-450%.

A coefficient of thermal expansion of the polyurethane polishing layer is 100-200 ppm/° C.

According to an embodiment, the isocyanate-terminated prepolymer comprises 8.5-9.5 wt % of unreacted —NCO groups.

According to an embodiment, a stoichiometric ratio of the unreacted —NCO groups in the isocyanate-terminated prepolymer to active hydrogen-containing groups in the curing agent composition is 1.05-1.20.

According to an embodiment, the polyamine curing agent is selected from a group consisting of aliphatic polyamines, aromatic polyamines and a mixture thereof. The number-average molecular weight of the aliphatic polyamine is 2000-6000. The number-average molecular weight of the aliphatic polyamine is 250-2000.

According to an embodiment, a hydrolytic stability of the polyurethane polishing layer is smaller than 1.5% when being hydrolyzed at a pH value of 2-5 for 80 h, and is smaller than 1.5% when being hydrolyzed at a pH value of 9-12 for 80 h.

According to an embodiment, the polyurethane polishing layer of the disclosure is a reaction product of a raw material combination; and the raw material combination includes an isocyanate-terminated carbamate prepolymer, a hollow microsphere polymer and a curing agent composition.

Based on a total weight of the curing agent composition, the curing agent composition includes:

5-55 wt % of a polyether diamine curing agent;
0.1-8 wt % of a polyamine curing agent; and
40-90 wt % of an aromatic bifunctional curing agent.

The elongation at break of the polyurethane polishing layer is 50-200%, and the coefficient of thermal expansion of the polyurethane polishing layer is 100-140 ppm/° C.

In this specific embodiment, by introducing the curing agent having a functionality of equal to or greater than 3, the polyurethane forms a body type crosslinked netlike structure, in which chemical bonds having strong interaction replaces hydrogen bonds having weak interaction, so that the coefficient of thermal expansion of the polishing layer is reduced, and the hydrolytic stability and uniformity of the removal rate are improved.

In this specific embodiment, a hydrolytic stability of the polyurethane polishing layer is smaller than 0.65% when being hydrolyzed at a pH value of 2-5 for 80 h, and is smaller than 0.80% when being hydrolyzed at a pH value of 9-12 for 80 h.

According to an embodiment, the polishing layer of the disclosure further has at least one endpoint detection area.

The disclosure further provides a preparation method of the above-mentioned polyurethane polishing layer. In the preparation method, a composition having multiple components and a low melting point is used as a curing agent, such that an initial reaction temperature is 70° C. or below. In this way, locally overheating in the polyurethane castable, which is caused by that the heat of the curing reaction in the central part of the castable cannot be rapidly released, is effectively avoided. The uniformity of properties such as a density and hardness of each part after the castable is cured is significantly improved. Hence it is assured that the polishing layer obtained by cutting the casting block in the method of disclosure has uniform quality at a center and an edge, and the quality of each polishing layer taken from different parts of the casting block is also uniform. Therefore, the preparation method of the disclosure can reproducibly manufacture polishing layers with uniform quality.

Specifically, the disclosure provides a preparation method of the above-mentioned polyurethane polishing layer, which includes the following operations.

An isocyanate-terminated prepolymer in a liquid state is mixed with a hollow microsphere polymer, and degassed in vacuum to obtain a first product.

The first product is mixed with a curing agent composition at 50° C. under high-speed shearing to obtain a second product.

A temperature of the second product is controlled, and a curing reaction is carried out under a condition that an initial reaction temperature is ≤70° C. and a reaction peak temperature is ≤80° C.

The disclosure further provides a polishing pad based on the above-mentioned polyurethane polishing layer, in which the above-mentioned polyurethane polishing layer is used as a functional layer. The polishing pad may be used for planarization treatment on a surface of a wafer with a higher precision, to obtain a brighter and cleaner surface.

In view of this, the disclosure provides a chemical-mechanical polishing pad;

and the chemical-mechanical polishing pad has the above-mentioned polyurethane polishing layer.

The disclosure further provides a method for planarizing a base material, which includes the following steps.

The base material is provided, in which the base material has a surface.

The above-mentioned chemical-mechanical polishing pad is provided.

The surface of the base material is dynamically polished by the chemical-mechanical polishing pad.

Specifically, the dynamic polishing is carried out in presence of a polishing solution during which the chemical-mechanical polishing pad is rotated relative to the base material at a certain pressure.

The base material is selected from at least one of a semiconductor base material, an optical base material and a magnetic base material.

For different base materials, the polishing layer is required to have different physical and chemical properties, and the removal rate and pressure applied during polishing are also different. All of these factors can be specifically selected by a person skilled in the art according to an actual requirement.

Further, the inventor found that a combination of aromatic polyamines and aliphatic polyols is basically used in a multi-component curing agent system, which respectively provide a hard section and a soft section of a curing agent. By adjusting a ratio of the aromatic polyamines to the aliphatic polyols, a hardness of the final polishing pad may be controlled. In such a curing agent composition, a congenital defect is inevitable, that is, the reactivity of the aromatic polyamines and the aliphatic polyols when reacting with free isocyanates are different. The reactivity of the aromatic polyamines is usually tens or even hundreds of times more than that of the aliphatic polyols. As a result, in a reaction process, the aromatic polyamine reacts preferably, such that a nonuniform gel in the reaction system is generated. Further, it is difficult for the aliphatic polyol to participate in the reaction, such that the reaction degree may not be uniform, thus affecting the polishing property finally.

The inventor further surprisingly found that, compared with a primary amine terminated polyether compound, a secondary amine terminated polyether compound has a significantly lowered reaction speed, which is substantially close to that of the aromatic amine curing agent. In this way, the nonuniform phenomenon of a polishing layer caused by the difference in the reactivity is fundamentally avoided, thereby obtaining a polyurethane polishing layer by which a removal rate and a defect rate of a polished base material can be improved simultaneously.

In view of this, a second objective of the disclosure is to provide a polishing pad having a polyurethane polishing layer. The polishing layer is prepared by a bicomponent curing agent system of an aliphatic compound and an aromatic compound. The reactivity of the aliphatic curing agent is adjusted by modifying a structure thereof, so that the reactivity of the aliphatic curing agent is close to that of the aromatic curing agent. In this way, the nonuniform phenomenon of the polishing layer caused by the difference in the reactivity is fundamentally avoided, thereby obtaining the chemical-mechanical polishing pad with improved polishing properties.

Therefore, a second aspect of the disclosure provides a chemical-mechanical polishing pad, which includes a polyurethane polishing layer. The polyurethane polishing layer is a reaction product of a raw material combination. The raw material combination includes an isocyanate-terminated prepolymer, a hollow microsphere polymer and a curing agent composition.

The curing agent composition includes a secondary amine terminated polyether curing agent and an aromatic bifunctional curing agent. A mass ratio of the secondary amine terminated polyether curing agent to the aromatic bifunctional curing agent is 1:4-4:1.

The isocyanate-terminated prepolymer comprises 5.5-9.5 wt % of unreacted —NCO groups.

According to an embodiment, a number-average molecular weight of the secondary amine terminated polyether curing agent is 250-6000. If necessary, the number-average molecular weight of the secondary amine terminated polyether curing agent may be adjusted within various ranges, for example, 400-800, or 1000-2000, 3000-4000, 5000-6000, 1500-2200 or 3500-5600, etc., preferably 400-800 or 1000-2000.

According to a specific embodiment, the secondary amine terminated polyether curing agent includes at least one compound selected from the following compounds represented by a general formula I and a general formula II:

General Formula I

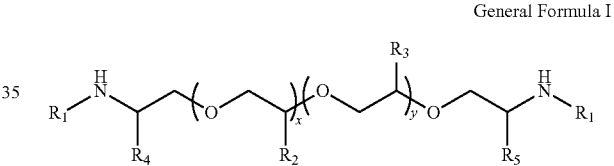

Where, $R_1$ is a C1-C8 alkyl or fluorine-containing alkyl, each of $R_2$, $R_3$, $R_4$ and $R_5$ independently is H or a C1-C8 alkyl or fluorine-containing alkyl, and x and y respectively are 0 or a positive integer, with a premise of $x+y \leq 12$.

General Formula II

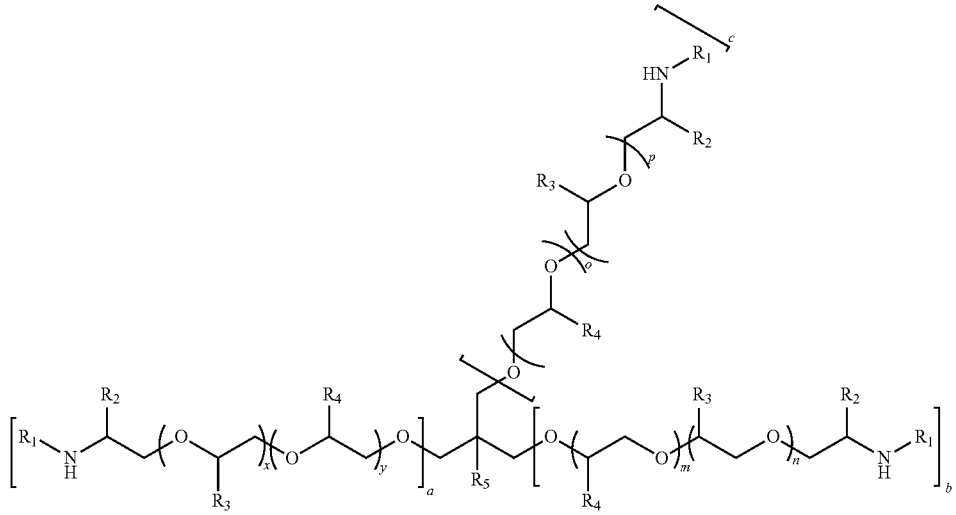

Where, $R_1$ is a C1-C8 alkyl or fluorine-containing alkyl, each of $R_2$, $R_3$, $R_4$ and $R_5$ independently is H or C1-C8 alkyl or fluorine-containing alkyl, a=b=c=1, and x, y, m, n, o and p respectively are 0 or a positive integer, with a premise of x+y+m+n+o+p≤12.

According to an embodiment, the compound of the general formula I or II may be a perfluoro-substituted compound. One example is a compound of the following formula:

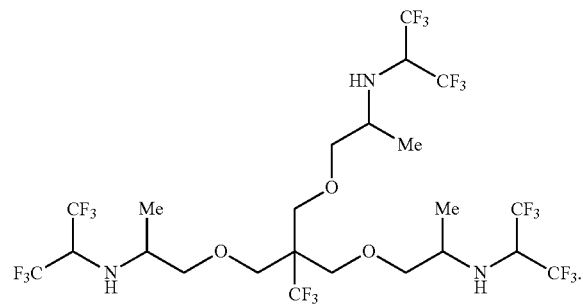

According to an embodiment, the aromatic bifunctional curing agent is an aromatic diamine. Preferred examples are MOCA (4,4'-methylene-bis-(o-chloroaniline), MCDEA (4,4'-methylene-bis-(3-chloro-2,6-diethylaniline)), and the like, but is not limited thereto. The MOCA is the most preferable.

According to a preferred embodiment, the curing agent composition used by the disclosure is a bicomponent curing agent system consisting of the secondary amine terminated polyether curing agent and the aromatic bifunctional curing agent.

According to a preferred embodiment, the raw material combination further includes the hollow microsphere polymer.

Physical and chemical properties of the polyurethane polishing layer according to the disclosure are not particularly limited, and may be adjusted according to a specific requirement of a material to be polished. Generally, the polishing layer has a density of 0.6-1.1 g/cm³ and a Shore hardness of 45-75 D. Preferably, the density of the polishing layer is 0.7-1.05 g/cm³, more preferably 0.8-1.0 g/cm³. Preferably, the Shore hardness of the polishing layer is 55-70, more preferably 55-65.

According to an embodiment, the polishing pad of the disclosure further has an endpoint detection window. An absolute value of a difference between the Shore hardness of the endpoint detection window and the Shore hardness of the polyurethane polishing layer is ≤5.

The endpoint detection window is made from a material having a visible light transmittance of ≥40%, preferably ≥60%.

Generally, the endpoint detection window has an area accounting for 0.1%-0.5% of a total area of the polishing pad, and is located at a position 1/2 to 1/3 from a center to an edge of the polishing pad, but is not limited thereto.

According to an embodiment, the polishing pad of the disclosure is further provided with a groove on a polishing surface. The groove is configured to receive a polishing solution. The groove may have a shape of concentric rings or spirals, grid lines, a polygon or a tire tread and the like, but is not limited thereto. A cross section of the groove may be, for example, a rectangle with vertical sidewalls, a "V" shape, a "U" shape and a zigzag shape. The groove has a width of 0.1-0.6 cm. More preferably, the groove has a width of 0.2-0.4 cm.

According to a second aspect, the disclosure further provides a method for planarizing a base material, which includes the following steps.

The base material is provided, in which the base material has a surface.

The above-mentioned chemical-mechanical polishing pad is provided.

The surface of the base material is dynamically polished by the chemical-mechanical polishing pad.

Specifically, the dynamic polishing is carried out in presence of a polishing solution during which the chemical-mechanical polishing pad is rotated relative to the base material under a certain pressure.

The base material is selected from at least one of a semiconductor base material, an optical base material and a magnetic base material.

For different base materials, the polishing layer is required to have different physical and chemical properties, and the removal rate and pressure applied during polishing are also different. All of these factors can be specifically selected by a person skilled in the art according to an actual requirement.

The polyurethane polishing layer provided by the disclosure is prepared by a curing agent system of an aliphatic secondary amine terminated polyether compound and an aromatic compound. Reactivity of a traditional aliphatic curing agent (such as polyether polyols) is effectively adjusted by modifying a molecular structure thereof.

Further, the secondary amine terminated polyether more preferably used in the curing agent system of the disclosure is a low-viscosity liquid at a room temperature, and can reduce a freezing point of a curing agent composition after being mixed with the aromatic curing agent, so that a curing reaction may be completed at a lower temperature. In this way, the release of heat of the reaction is suppressed, and the striation caused by overquick heat release or nonuniform heat release is effectively reduced, such that the uniformity of a polishing pad is improved.

BRIEF DESCRIPTION OF THE DRAWINGS

In order to describe the technical solutions in the Examples of the disclosure or in the conventional art more clearly, a simple introduction to the accompanying drawings which are needed for the description of the Examples or the conventional art is given below. A same numeral in the accompanying drawings indicates a same component. The shape and size of each component in the schematic accompanying drawings are merely illustrative, and cannot be considered as representing actual shape, size, and an absolute position.

Figure 1:
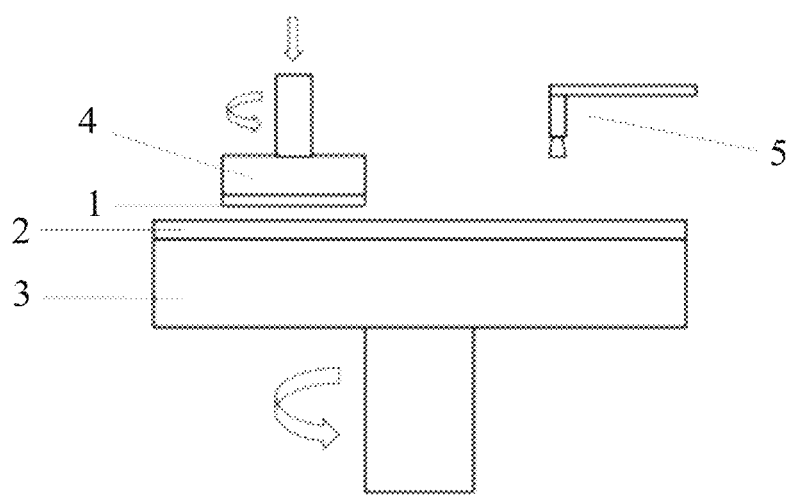
FIG. 1 is a schematic diagram of a process for polishing work with a polishing layer provided by an Example of the disclosure.

In the figures: 1. to-be-polished material, 2. polishing pad, 3. polishing machine table, 4. carrier, and 5. polishing solution.

DETAILED DESCRIPTION

Embodiments of the disclosure are described below in detail in combination with Examples. However, it is to be understood by a person skilled in the art that the following Examples are merely for illustrating the disclosure and should not be considered as a limit to a scope of the disclosure. Those without indicating a specific condition in the Examples are carried out according to a conventional condition or a condition suggested by a manufacturer. An agent or an instrument without indicating a manufacturer thereof may be a conventional product which is commercial available.

In the whole specification, unless otherwise specified, the term used herein should be understood as a meaning generally used in the art. Therefore, unless otherwise defined, all technical and scientific terms used in the specification have a same meaning generally understood by the person skilled in the art. In case of any contradiction, this specification takes precedence.

A polyurethane polishing pad is a polishing tool used more broadly. However, along with an increasingly high requirement for a technical standard of machining and manufacturing, it is difficult for an existing polyurethane polishing tool to meet the requirement. It is known to the inventor that a polyurethane-based polishing tool is mostly prepared by a casting-cutting process. A manufacturing flow of the casting-cutting process is as follows: an isocyanate-terminated prepolymer is heated to a certain temperature so that the prepolymer has an appropriate viscosity; a small molecular compound in the prepolymer is removed by degassing in vacuum; and then a hollow microsphere polymer is added by mixing; and then degassing in vacuum is performed again for a certain time; and thereafter, the mixture is mixed with a curing agent composition, followed by casting into a polyurethane block, and the polyurethane block is cut to form a sheet of a polishing layer.

In a first aspect of the disclosure, the inventor found by researching that an isocyanate-terminated carbamate prepolymer is a viscous liquid at a room temperature, and needs to be heated to a certain temperature to reduce the viscosity, such that gas therein is facilitated to be expelled in vacuum. On the other hand, a low viscosity is also required for mixing with the curing agent conveniently. If the viscosity is too high, the prepolymer and the curing agent may not be mixed uniformly, which affects a polishing effect of a polishing pad.

Additionally, if the temperature is too high, the viscosity may be too low. In this case, the hollow microsphere polymer tends to be a separated phase. As a result, the hollow microsphere polymer is not uniformly distributed in the prepolymer, such that densities of polishing layers cut from top and bottom positions of a polyurethane block obtained by casting have a big difference, that is, the polishing layer cut from the top has a lower density and the one cut from the bottom has a higher density. On the other hand, if the temperature of the prepolymer is too high, a reaction may be too rapidly after the prepolymer is mixed with the curing agent. Consequently, a great deal of heat is released within a short time, which causes an irreversible expansion of a polyurethane casting block. As reflected in a single polishing layer, a central density is lower and an edge density is higher.

It can thus be seen that the temperature of the isocyanate-terminated prepolymer needs to be controlled within an appropriate range, and cannot be too high or too low. If the temperature is too high, the reaction between the prepolymer and the curing agent is too fast. If the temperature is too low, the prepolymer may not be mixed with the curing agent uniformly due to an increased viscosity of the curing agent. It is an optional practice to control the temperature at 50±1° C.

Based on the above description, the inventor proposes a multi-component (two, or three, or more components) curing agent composition, which has a low use temperature and melting point. In other words, by using the curing agent composition, the prepolymer is allowed to react and further be cured at a low initial reaction temperature, such that a cured product (such as the polyurethane casting block) with improved properties may be obtained. Further, by using the foregoing cured product, the polishing layer with excellent chemical and mechanical polishing properties can be obtained.

An aliphatic diamine curing agent is a liquid or a viscous liquid at a room temperature. The inventor found that the melting point of a mixture is significantly reduced after the aliphatic diamine curing agent is mixed with an aromatic curing agent, such as 4,4'-diamino-3,3'-dichlorodiphenylmethane (MOCA). Moreover, the greater the amount of the aliphatic diamine curing agent is used, the lower the melting point of the mixture is. Additionally, during the temperature of the mixture is reduced, the mixture usually has a lower freezing temperature due to an overcooling phenomenon.

In some examples, the inventor surprisingly found that the mixture is still a low-viscosity liquid when the temperature is reduced to 70° C., after 20 wt % of polyether diamine D2000 is added to the aromatic curing agent (MOCA). When the curing agent composition having the use temperature that can be as low as 70° C. is used to react with the isocyanate terminated prepolymer, compared with the MOCA curing agent (a single-component curing agent) having a use temperature of 116° C. for a curing reaction, the temperature of the former (the bicomponent curing agent composition) after mixing reduces more significantly than the later (the single-component curing agent), and thus the initial reaction temperature is low. For example, 100 parts of prepolymer at 50° C. are mixed with 50 parts of MOCA having the use temperature of 120° C., and the temperature after mixing is 74° C. However, if the prepolymer is mixed with the curing agent composition having the use temperature of 70° C. according to the disclosure, the temperature is reduced to 56° C., which decreases by nearly 20° C. Therefore, the intense heat release in the reaction process is effectively suppressed, such that the heat can be released slowly and smoothly, obtaining a cured product with a highly uniform density.

In addition, the inventor further found that a coefficient of thermal expansion of the polishing pad can be effectively reduced and a hydrolytic stability can be improved by adding an appropriate amount of a polyfunctional curing agent having a functionality of equal to or greater than 3 to the curing agent system. Based on the curing agent composition, the inventor further proposes a polyurethane polishing layer and a polishing pad including the polyurethane polishing layer.

The polyurethane polishing layer of the disclosure and a preparation method thereof, and the polishing pad having the polishing layer of the disclosure are described below in detail in combination with specific embodiments of the disclosure.

Herein, unless otherwise stated, a certain component is not limited to one substance, and may be one, two or more substances.

For example, the aliphatic diamine curing agent in the curing agent composition mentioned herein may be one specific aliphatic diamine curing agent, and may also be a mixture of two or more aliphatic diamine curing agents. The aromatic diamine curing agent may be one specific aromatic diamine curing agent, and may also be a mixture of two or more aromatic diamine curing agents.

For example again, the polyamine curing agent is selected from an aliphatic polyamine curing agent, an aromatic polyamine curing agent and a mixture thereof. It means that the polyamine curing agent may consist of one specific aliphatic polyamine curing agent, or consist of a mixture of two or more aliphatic polyamine curing agents; or may consist of one specific aromatic polyamine curing agent, or a mixture of two or more aromatic polyamine curing agents; or may further jointly consist of one, two or more specific aliphatic polyamine curing agents and one, two or more specific aromatic polyamine curing agents.

Polyurethane Polishing Layer

The polyurethane polishing layer is a polishing layer manufactured based on polyurethane. "Polyurethane" is a product derived from bifunctional or polyfunctional isocyanates, for example, a mixture or a copolymer of two or more of polyether urea, polyisocyanurate, polycarbamate, polyurea, and polyurethane urea. In addition, a polishing effect of the prepared polishing layer may be effectively improved by adjusting chemical components.

In some preferred examples, the polishing layer is a product prepared by reacting an isocyanate-terminated prepolymer with a curing agent mixture, in which the isocyanate-terminated prepolymer is obtained by reacting a polyisocyanate and a polyether polyol. An appropriate modified material may further be added to the polishing layer, to obtain a more excellent improvement of an overall property.

In the disclosure, the polyurethane polishing layer is a reaction product produced by a reaction of a raw material combination including multiple components. The raw material combination includes an isocyanate-terminated prepolymer, a hollow microsphere polymer and a curing agent composition. The hollow microsphere polymer is mixed in the isocyanate-terminated prepolymer, and an initial reaction temperature after the mixture being mixed with the curing agent composition may be lower than 70° C. Preferably, the initial reaction temperature is lower than 60° C.

A peak reaction temperature appears at 2 to 5 minutes after mixing, and the peak reaction temperature is lower than 80° C.

The polyurethane polishing layer prepared from the raw materials provided in the disclosure has the following physical and chemical properties.

In some examples, the density of the obtained polyurethane polishing layer is approximately 0.6-1.1 $g/cm^3$, preferably 0.7-1.05 $g/cm^3$, and most preferably 0.8-1.0 $g/cm^3$.

The Shore D hardness is 35-75 D, more preferably 45-70 D, and most preferably 55-65 D. When the hardness is greater than 75 D, the polyurethane polishing layer has a very high removal rate, but many defects such as scratching may be accompanied. When the hardness is smaller than 35 D, the removal rate is decreased significantly, though scratching can be effectively reduced. Therefore, in order to keep a balance between the scratching and the removal rate, the polishing layer with appropriate hardness should be selected.

An elongation at break is 50-450%, or 50-200%. More preferably, the elongation at break is 60-350%. Most preferably, the elongation at break is 70-300%. Generally, the polishing layer having a Shore D hardness smaller than 45 has a very high elongation at break (that is, >500%). The material having such a high elongation at break has a reversible deformation when machining, resulting in that an unsatisfied groove is formed which is unacceptable, and a texture may not be formed sufficiently when the material is trimmed by diamond.

Polyurethane-Terminated Prepolymer

The prepolymer in the disclosure is obtained by a reaction of a polyfunctional isocyanate and a polyether polyol. Preferably, the polyurethane-terminated prepolymer comprises 8.5-9.5 wt % of unreacted isocyanate groups (—NCO). Particularly, the prepolymer is a prepolymer terminated by two —NCO groups.

In some optional examples, a stoichiometric ratio of the unreacted —NCO groups in the prepolymer to active hydrogen-containing groups (amino or hydroxyl) in the curing agent composition is 1-1.25, more preferably 1.05-1.2. In a specific embodiment, the ratio (stoichiometric ratio) of a total sum of the active hydrogen-containing groups (including —$NH_2$ and —OH) to the unreacted —NCO is based on a chain extension coefficient.

In some other examples, when the polyfunctional isocyanate reacts with the polyether polyol, the ratio of the —NCO groups to the OH (hydroxyl) containing an active hydrogen may be controlled in a range of 1.1-5.0, preferably 1.2-2.5. Under a condition where the ratio of the —NCO groups to the OH groups containing the active hydrogen is smaller than 1.1, the prepolymer has a tendency of having a high molecular weight, thereby being cured or gelled during a synthetic process. On the other hand, when the ratio of the —NCO groups to the —OH groups containing the active hydrogen is greater than 5.0, a reaction speed of the reaction with the curing agent is too fast because a great amount of unreacted isocyanate remain, such that the formability of the polyurethane resin casting block tends to become poor.

Preferably, the polyisocyanate-terminated prepolymer is a polyether-based isocyanate-terminated carbamate prepolymer. A content of unreacted —NCO in the carbamate prepolymer is 8.5-9.5 wt %. More preferably, the content of the unreacted —NCO is controlled in a range of 8.6-9.25 wt %.

The prepolymer used in the disclosure may be a commercially-available prepolymer obtained by a reaction of polyether with TDI and MDI. Examples of the prepolymer may be but are not limited to LF800A, LF900A, LF910A, LF930A, LF931A, LF939A, LF950A, LF952A, LF600D, LF601D, LF650D, LF667D, LF700D, LF750D, LF751D, LF752D, LF753D, L325, LFG963A, LFG964A and LFG740D of Adiprene® series produced by Chemtura Company.

In the raw materials for preparing the prepolymer, the polyfunctional isocyanate includes but not limited to one or two of aromatic isocyanates and aliphatic isocyanates. Preferably, the aromatic isocyanate is used in an amount of 90 mol % or more, more preferably 95 mol % or more, and particularly preferably 100 mol % or more.

The aromatic isocyanate may be aromatic diisocyanates. The aromatic diisocyanate includes but not limited to one or more of 2,4-toluene diisocyanate, 2,6-toluene diisocyanate, 2,2'-diphenylmethane diisocyanate, 2,4'-diphenylmethane diisocyanate, 4,4'-diphenylmethane diisocyanate, 1,5-naphthalene diisocyanate, p-phenylene diisocyanate, m-phenylene diisocyanate, terephthalylidene diisocyanate, and isophthalylidene diisocyanate.

The aliphatic isocyanate may be aliphatic diisocyanates. The aliphatic isocyanate includes but not limited to one or more of ethylidene diisocyanate, 2,2,4-trimethyl hexamethylene diisocyanate, and 1,6-hexamethylene diisocyanate. The aliphatic isocyanate may further be alicyclic diisocyanates. The alicyclic isocyanate includes but not limited to one or more of 1,4-cyclohexyl diisocyanate, 4,4'-dicyclohexylmethane diisocyanate, isophorone diisocyanate, and norbornane diisocyanate.

In the raw materials for preparing the prepolymer, the polyether polyol may be polyether-based high molecular weight polyol. For example, the polyether polyol includes but not limited to any one of, or a copolymer of two or more of, or a mixture of two or more of polytetramethylene ether glycol (PTMEG), polyethylene glycol (PEG), polypropylene glycol (PPG), and polytetramethylene ether glycol-polyethylene glycol, polytetramethylene ether glycol-polypropylene glycol and polyethylene glycol-polypropylene glycol. As an optional example, a number-average molecular weight of the polyether polyol may be 500-5000, or 500-2000, or 500-1500. It is to be noted that when the polyether polyol having the number-average molecular weight smaller than 500 is used, the obtained polyurethane resin does not have an sufficient elastic characteristic, and tends to be a fragile polymer. The polishing pad formed by the foregoing polyurethane resin (the fragile polymer) may be excessively hard, and may be a reason for the occurrence of scratching on the surface of an object being polished. Moreover, such a polishing pad is easily worn to shorten a service life of a grinding point. When the polyether polyol having the number-average molecular weight greater than 5000 is used, the polishing pad prepared by the polyurethane resin obtained thereby may be soft, and it may be difficult to obtain a fully satisfactory planarity.

Curing Agent Composition

The curing agent composition of the disclosure is mainly obtained by mixing an aliphatic curing agent and an aromatic curing agent. In other words, the curing agent composition may be a bicomponent curing agent system.

In particular, the curing agent composition of the disclosure may include an aliphatic diamine curing agent, an aromatic bifunctional curing agent and optionally a polyamine curing agent. The polyamine curing agent may be selected from aliphatic polyamines and aromatic polyamines.

The term "polyamine" curing agent mentioned herein refers to a curing agent comprising three or more amino groups, unless otherwise stated particularly.

Further, regarding an amount of the curing agent composition, as an example, based on a total weight of the curing agent composition, the curing agent composition includes 5-55 wt % of an aliphatic diamine composition, 0-8 wt % of a polyamine composition and 40-90 wt % of an aromatic bifunctional composition.

Still further, based on the total weight of the curing agent composition, the curing agent composition of the disclosure may include 5-55 wt % of an aliphatic diamine composition, 0.1-8 wt % of a polyamine composition and 40-90 wt % of an aromatic bifunctional composition.

A molecular structure of the polyamine composition comprises three primary amine groups or three secondary amine groups. The polyamine composition may be aliphatic polyamines, aromatic polyamines and a mixture thereof. The number-average molecular weight of the aliphatic polyamine may be 2000-6000, and the number-average molecular weight of the aliphatic polyamine may be 250-2000.

Each component in the curing agent composition is further elaborated below respectively.

Aliphatic Diamine Curing Agent

The aliphatic diamine curing agent may be a curing agent which is a liquid at a normal temperature (generally referring to a room temperature, such as 25-30° C.). Preferably, the number-average molecular weight of the aliphatic diamine curing agent is 1000-5000. When the number-average molecular weight of the aliphatic diamine is smaller than 1000, the curing reaction of the prepolymer is too fast, and the prepolymer is gelled rapidly. When the molecular weight of the polyether polyamine is greater than 5000, a polishing pad formed thereby may be soft, and it is difficult to obtain the fully satisfactory planarity. The number-average molecular weight of the aliphatic diamine may be, for example, 2000-3000, or 4000-5000, or 1050-2500, or 3500-4600, but is not limited thereto.

In the curing agent composition of the disclosure, based on a total weight of the composition, the aliphatic diamine curing agent accounts for 5-55 wt %. When the amount of the aliphatic diamine in the curing agent composition is lower than 5 wt %, the effect for reducing a melting point of the curing agent composition is not significant. When the amount of the aliphatic bifunctional polymer curing agent is higher than 55%, the polyurethane polishing layer obtained by curing may be soft, and the planarization capacity is reduced.

The aliphatic diamine curing agent that may be used in the disclosure may be any existing aliphatic diamine curing agent which is a liquid at the room temperature and meets the above molecular weight range.

Preferably, the aliphatic diamine curing agent is polyether diamines. The polyether diamine that may be used in the disclosure may be a commercially-available and applicable product. For example, the polyether amine includes Jeffamine® series of polyether amines from Huntsman Company, such as D230, D400, D2000, D4000, HK511, ED600, ED900, ED2003, SD231, SD401, SD404 and SD2001, but is not limited thereto.

Aromatic Bifunctional Curing Agent

The aromatic bifunctional curing agent in the disclosure is included in the curing agent composition as a structure regulator of a hard section.

The aromatic bifunctional curing agent is not particularly limited by the disclosure, and may be any appropriate aromatic bifunctional curing agent in the art. A person skilled in the art may make an appropriate selection according to a specific requirement. Examples of the aromatic bifunctional curing agents include but not limited to: diethyltoluenediamine (DETDA), N,N'-dialkyl diaminodiphenylmethane, 3,5-diethyl-2,4-toluenediamine and an isomer thereof (such as 3,5-diethyl-2,6-toluenediamine), 3,5-dimethylthio-2,4-toluenediamine and an isomer thereof, 4,4'-methylene-bis-(2-chloroaniline) (MOCA), 4,4'-bis-(sec-butylamino)-diphenylmethane, 1,4-bis-(sec-butylamino)-benzene, 4,4'-methylene-bis-(2-chloroaniline), 4,4'-methylene-bis-(3-chloro-2,6-diethylani line) (MCDEA), polytetramethyleneoxide-di-p-aminobenzoate, p,p'-methylene dianiline (MDA), m-phenylenediamine (MPDA), 4,4'-methylene-di-(2,6-diethyl aniline) (MDEA), 4,4'-methylene-di-(2,3-dichloroaniline) (MDCA), 4,4'-diamino-3,3'-diethyl-5,5'-dimethyldiphenylmethane, 2,2',3,3'-tetrachlorodiamino diphenylmethane, propylene glycol-di-p-aminobenzoate and a mixture thereof. More preferably, the bifunctional curing agent B3 is selected from one or more of 4,4'-methylene-bis-(2-chloroaniline), 4,4'-methylene-bis-(3-chloro-2,6-diethylaniline) (MCDEA) and an isomer thereof.

Preferably, the aromatic bifunctional curing agent is selected from 4,4'-methylene-bis-(2-chloroaniline) (MOCA), 4,4'-methylene-bis-(3-chloro-2,6-diethylaniline) (MCDEA) and an isomer thereof.

More preferably, the aromatic bifunctional curing agent is MOCA. A unique chemical structure of the MOCA may guarantee an appropriate operating time during preparing the polishing pad and the obtained polishing pad having good polishing properties.

In the curing agent composition of the disclosure, based on the total weight of the composition, the aliphatic diamine curing agent accounts for 40-90 wt %.

Polyamine Curing Agent

The disclosure may not include any polyamine curing agent, and may also include one polyamine curing agent or a mixture of two or more polyamine curing agents.

For a polyurethane polishing layer, a good dimensional stability and a hydrolytic stability are particularly crucial for a polishing process. On one hand, the polishing work generally involves the use of a polishing solution. The polishing solution generally has a certain alkalinity or acidity, and a pH value may be between 2 to 12. During continuous polishing work, the polishing solution has a continuous corrosive action to the polishing pad, such that the polishing layer is swelled and thus the hardness of the polishing layer is reduced. As a result, during grinding, the removal rate of a same polishing layer in an early stage of the grinding is high, and the removal rate is gradually reduced over polishing time. On the other hand, due to a rubbing action during the grinding process, in the polishing pad prepared based on the above-mentioned polyurethane polishing layer, the temperature of the polishing layer is increased gradually and can be increased close to 85° C. However, a temperature of a buffer layer is still low. As a significant temperature difference is present between the polishing layer and the buffer layer, a stress between the polishing layer and the buffer layer may be present in a horizontal direction due to thermal expansion of the polishing layer, and thus a deguming risk is greatly increased.

The inventor found that it is efficient to control the degumming and hardness reduction of the polishing layer by controlling a crosslinking degree of the polyurethane. In this embodiment of the disclosure, the crosslinking degree of the polyurethane body may be controlled, for example, by introducing a molecule having a functionality equal to or greater than 3 (to be provided as one component in the curing agent composition) to convert a linear polyurethane into a body type crosslinked netlike structure. In the polyurethane with the body type crosslinked netlike structure, an interaction force between molecular chains is a strong chemical bond instead of a weak physical action "-hydrogen bond-." The chemical bond may effectively reduce the coefficient of thermal expansion of the polishing layer, lower the degumming risk, improve the hydrolytic resistance, and improve the uniformity of the removal rate in a planarization process. In addition, by adjusting an additive amount of the polyamine curing agent, a crosslinking density of the polishing pad can be effectively adjusted to achieve the optimal polishing effect.

As an optional example, each molecule of the polyamine curing agent at least comprises three primary amine groups or secondary amine groups, for example, three primary/secondary amine groups, or four primary/secondary amine groups, or five primary/secondary amine groups, or six primary/secondary amine groups, or seven primary/secondary amine groups. More preferably, each molecule of the polyamine curing agent comprises three primary amine groups or secondary amine groups. By using a component having multiple groups with an active hydrogen (amino or hydroxyl) in the curing agent, the crosslinking degree in the polyurethane polishing layer may be improved appropriately, thus improving the properties of the polishing layer.

The polyamine curing agent that may be used in the disclosure may be aliphatic polyamines and/or aromatic polyamines.

Preferably, a number-average molecular weight of the polyamine curing agent that may be used in the disclosure may be 250-6000. For example, the number-average molecular weight of the polyamine curing agent may be 1000-2000, or 3000-4000, or 5000-6000, or 1500-2200, or 3500-5600, but is not limited thereto. When the polyamine curing agent is the aliphatic polyamine, the molecular weight of the aliphatic polyamine may be 2000-6000. When the molecular weight is lower than 2000, the reaction of the aliphatic polyamine in the reaction process is too fast, so that the polyurethane is rapidly gelled and the operability is extremely poor. When the molecular weight of the aliphatic polyamine is greater than 6000, a crosslinking capacity to the system is greatly reduced, and thus purposes of effectively improving the crosslinking density of the system, reducing the coefficient of thermal expansion of the polishing pad and improving the hydrolytic stability cannot be achieved.

A polyamine polyether curing agent may be, for example, polyether amine Jeffamine®T3000, T5000, T403 and ST404 from Huntsman, but is not limited thereto. When the polyamine curing agent is the aromatic polyamine, the molecular weight of the aromatic polyamine is 250-2000. When the molecular weight of the aromatic polyamine is lower than 250, the reactivity is overhigh, so that the polyurethane is rapidly gelled and the operability is poor. When the molecular weight is higher than 2000, the melting point of the aromatic polyamine is too high and such an aromatic polyamine is not suitable for preparing the polyurethane casting block.

The aromatic polyamine curing agent used in the disclosure may be selected from 4,4',4"-triamino(triphenylmethane), 4,4',4"-triamino(triphenylethane), N,N',N"-triisopropyl-4,4',4"-triamino(triphenylmethane), N,N',N'- triisopropyl-4,4',4"-triamino(triphenylethane), sym-triaminobenzene and unsym-triaminobenzene, but is not limited thereto.

In the polyurethane polishing layer provided by the disclosure, the crosslinking density of the polyurethane may be controlled by controlling a content of the polyamine curing agent in the curing agent composition, so as to effectively reduce the elongation at break of the obtained polyurethane polishing layer.

In the disclosure, based on the total weight of the curing agent composition, the content of the polyamine curing agent is 0-8 wt %, preferably 0.1-8 wt %. In some preferred examples, the content of the polyamine curing agent is 1-5 wt %, most preferably 2.5-3.5%. By appropriately increasing the content of the polyamine curing agent, the crosslinking density of the polyurethane may be effectively adjusted. However, if the additive amount of the polyamine curing agent is greater than 8%, the crosslinking density of the polyurethane may be too large, such that the polishing pad is insufficient in elasticity and is fragile.

By a crosslinking action of the polyamine curing agent, the coefficient of thermal expansion of the polyurethane polishing layer may be effectively reduced, and the coefficient of thermal expansion is controlled within 250 ppm/° C. In a preferred embodiment of the disclosure, the coefficient of thermal expansion of the polishing layer is 50-250 ppm/° C., or 100-150 ppm/° C., or 100-200 ppm/° C. More preferably, the coefficient of thermal expansion is 60-200 ppm/° C. Most preferably, the coefficient of thermal expansion is 70-160 ppm/° C. During grinding, an excessively high coefficient of thermal expansion causes a large temperature difference between the polishing layer and the buffer layer in the polishing pad, which results in the presence of stress and thus the increase of a degumming risk.

The polyurethane polishing layer is further affected by the polishing solution. The polishing solution generally has a certain alkalinity or acidity, and a pH value may be between 2 to 12. During continuous polishing work, the polishing solution has a continuous corrosive action to the polishing pad, such that the polishing layer is swelled and thus the hardness of the polishing layer is reduced. As a result, during grinding, the removal rate of a same polishing layer in an early stage of the grinding is high, and the removal rate is gradually reduced over polishing time. In the polishing process (a polishing service life of one polishing pad is generally 50-70 h), a constant removal rate has an important role to continuous industrial production. With the addition of the polyamine curing agent in the disclosure, the crosslinking density of the polishing layer is improved, the resistance of the polishing layer to the polishing solution may be improved, and it is guaranteed that the polishing layer has stable physical and chemical properties within its service life.

The resistance to the polishing solution may be expressed by the hydrolytic stability. "80 h hydrolytic stability" herein is measured by immersing the polishing layer in a hydrochloric acid solution having a pH of 2-5 and a NaOH solution having a pH of 9-12 for 80 h, followed by measuring a diameter change of the polishing layer relative to a diameter before the polishing layer is immersed. The "80 h hydrolytic stability" is expressed by a percentage of the diameter change value. The smaller the diameter change of the polishing layer, the better the stability of acid and alkali resistance. The 80 h acid and alkali hydrolytic stabilities of the polishing layer in the disclosure are both smaller than 1.5%. Further, the 80 h hydrolytic stability of the polishing layer in the hydrochloric acid solution having the pH of 2-5 is smaller than 0.65%. The 80 h hydrolytic stability of the polishing layer in the sodium hydroxide solution having the pH of 9-12 is smaller than 0.80%.

Hollow Microsphere Polymer

The hollow microsphere polymer is substantially an expandable microsphere. It may be a microsphere or a microbead available from any company of Akzo Nobel, Matsumoto Yushi-Seiyaku Co. LTD or Sekisui Chemical Co. LTD, preferably a hollow microsphere of Expancel series from Akzo Nobel or a microbead of F series from Matsumoto. As an optional example of the hollow microsphere polymer, the hollow microsphere polymer has a saclike structure with an outer wall of polyacrylonitrile and polyacrylonitrile copolymer.

The inventor found that a polishing effect of the polyurethane polishing layer may be controlled by adjusting the distribution (such as density) of the hollow microsphere polymer in the polyurethane polishing layer. For example, in a process of preparing the polyurethane polishing layer, preferably the hollow microsphere polymer is uniformly dispersed in the polishing layer. More preferably, the hollow microsphere polymer is uniformly distributed in the polishing layer so that the polishing layer has a porosity of 10-40%. By uniformly dispersing the hollow microsphere polymer in the polishing layer in combination with adjusting a particle size of the hollow microsphere polymer, the polishing property of the polishing layer may further be adjusted. For example, a diameter of the hollow microsphere polymer is controlled to be smaller than 120 µm. More preferably, the diameter is smaller than 60 µm. Most preferably, the diameter is 10-50 µm.

The polyurethane polishing layer prepared from the above raw materials is a polishing layer applicable to chemical-mechanical polishing work.

In the disclosure, an appropriate modifying material may further be added to the polyurethane polishing layer, to obtain a more excellent improvement in an overall property.

These modifying materials include but not limited to: an antioxidant, a wear-resistant filler, and a storage stabilizer, etc.

Endpoint Detection Area

In the disclosure, based on an actual requirement, a structure of the polyurethane polishing layer may be further improved so that the practicability thereof is more enhanced.

As an optional example, at least one endpoint detection area is formed on the polyurethane polishing layer. During polishing work, the endpoint detection area of the polyurethane polishing layer can be used for high-precision optical endpoint detection. A detection method may be, for example, optical detection. As the endpoint detection area is made from an appropriate material, it has an appropriate light transmittance, so as to observe an object (such as a silicon wafer) being polished. Preferably, the material forming the endpoint detection area has a light transmittance of ≥40% within an overall wavelength range of 300-800 nm. More preferably, the light transmittance of a high transmittance material is ≥60%.

Preferably, the material of the endpoint detection area includes but not limited to one or more of thermosetting resins, such as polyurethane resins, polyester resins, phenolic resins, urea resins, melamine resins, epoxy resins and acrylic resins; and thermoplastic resins, such as polyurethane resins, polyester resins, polyamide resins, cellulose resins, acrylic resins, polycarbonate resins, halogen-containing resins (polyvinyl chloride, polytetrafluoroethylene, polyvinylidene fluoride, etc.), polystyrene and olefin resins (polyethylene, polypropylene, etc.).

Preferably, the Shore hardness of the endpoint detection area is 40-65 D, and more preferably 45-55 D. When the Shore hardness of the endpoint detection area is smaller than 40 D, the area tends to be creepage, and it is difficult to stably carry out the optical endpoint detection. When the Shore hardness is greater than 65 D, scratching tends to occur on a surface of a material being polished.

Buffer Pad

In the disclosure, a buffer pad is further disposed on a back of the polyurethane polishing layer. The buffer pad can alleviate impact applied to the polishing pad in a polishing process.

Based on the polyurethane polishing layer, a buffer layer may be formed on a substrate, and then the polyurethane polishing layer is fixed on the buffer layer by gluing, so that the polyurethane based chemical-mechanical polishing pad may be obtained.

Preparation Method of the Polishing Layer

The disclosure further provides a preparation method of the above-mentioned polishing layer. The preparation method includes the following operations.

An isocyanate-terminated prepolymer in a liquid state is mixed with a hollow microsphere polymer, and degassed in vacuum to obtain a first product.

The first product is mixed with a curing agent composition at 50° C. under high-speed shearing to obtain a second product.

A temperature of the second product is controlled, so that an initial reaction temperature for the first product and the curing agent composition is ≤70° C. and a reaction peak temperature is ≤80° C.

Specific operation steps may include the follows.

(1) Optionally, a casting composition, from which an endpoint detection area having corresponding hardness can be prepared, is cast into an inner cavity of a mould, followed by curing, demoulding and surface sanding, to obtain a cylindrical block.

(2) The cylindrical block obtained in the optional step (1) is placed into an annular sidewall of a polishing layer mould, and the second product is cast into the annular inner cavity, and cured under a condition where the initial reaction temperature is ≤70° C. and the reaction peak temperature is ≤80° C., followed by demoulding and surface sanding to obtain a cylindrical cured block.

(3) The cured block is sliced, to obtain the polishing layer that is integrally formed and optionally has an endpoint detection area.

(4) Optionally, a groove is formed on the polishing layer.

Polishing Treatment

A schematic diagram of polishing treatment by using a chemical-mechanical polishing pad having the above-mentioned polishing layer may refer to FIG. 1. The polishing pad 2 is fixed on a polishing machine Table 3. A to-be-polished material 1 is fixed on a carrier 4. When polishing is performed, first the polishing pad 2 rotates under the action of the polishing machine table. Then, the to-be-polished material 1 vertically gets close (from top to bottom) to the polishing pad 2 via the carrier 4. The carrier rotates while moving downwards. The rotation direction of the carrier 4 is same as that of the polishing table 3, so that the rotation directions of the polishing pad 2 and the to-be-polished material 1 are the same. While the polishing is carried out, a polishing solution 5 is sprayed to the polishing pad 2.

According to a second aspect of the disclosure, the inventor surprisingly found that the reactivity of the aliphatic amine curing agent can be effectively reduced by a steric hindrance effect and an electronic effect, i.e., increasing the steric hindrance of an amino and reducing an electron cloud density of the amino. In particular, compared with a primary amine terminated polyether, a secondary amine terminated polyether has a significantly reduced reactivity, which is comparative with the reactivity of an aromatic bifunctional curing agent, particularly an aromatic diamine curing agent. As a result, a gelation phenomenon in an early stage of the curing and nonuniformity of a final product due to different reaction speeds of the curing agents are eliminated.

The inventor further found that the steric hindrance effect of the amino may be further effectively increased by a large substituent on a nitrogen atom of the secondary amine terminated polyether, such that the reactivity can be further reduced.

Therefore, a structure of the substituent of the amino may be adjusted according to a reactivity of a selected aromatic curing agent, such that a curing agent system in which the reactivity of each curing agent is comparable with each other may be obtained. In this way, a problem of poor uniformity of a multi-component curing agent system may be fundamentally solved.

Therefore, the inventor proposes that the reactivity of the aliphatic curing agent is adjusted by modifying the structure thereof, such that the reactivity of the aliphatic curing agent is close to that of the aromatic curing agent in the curing agent composition, thereby obtaining the polishing layer having uniform quality.

Polishing Layer

Generally, a preparation process of a polyurethane polishing layer is as follows: an isocyanate-terminated prepolymer is heated to a certain temperature so that the prepolymer has an appropriate viscosity, and preferably, a hollow microsphere polymer may be mixed therein to adjust a density of a final product. Then, the mixture is mixed with a curing agent and cast to form a polyurethane castable. The polyurethane castable is cured under a certain condition to form a polyurethane material block. Then, the polyurethane material block is cut into sheets having a certain thickness to be used as a polishing layer of a polishing pad.

The polyurethane polishing layer refers to a polishing layer prepared based on polyurethane. "Polyurethane" is a product derived from bifunctional or polyfunctional isocyanates, for example, a mixture or a copolymer of two or more of polyether urea, polyisocyanurate, polycarbamate, polyurea, and polyurethane urea. In addition, a polishing effect of the prepared polishing layer may be effectively improved by adjusting chemical components.

In the disclosure, the polyurethane polishing layer includes a reaction product produced by a reaction of multiple raw materials. The multiple raw materials include an isocyanate-terminated prepolymer, a curing agent composition, and an optional hollow microsphere polymer that will described below in detail. Preferably, the hollow microsphere polymer is mixed in the isocyanate-terminated prepolymer, and the mixture is mixed with the curing agent composition for a curing reaction.

The polyurethane polishing layer prepared from the provided raw materials in the disclosure has the following physical and chemical properties.

The density of the obtained polyurethane polishing layer is 0.6-1.1 $g/cm^3$, preferably 0.7-1.05 $g/cm^3$, and more preferably 0.8-1.0 $g/cm^3$.

The Shore D hardness of the obtained polyurethane polishing layer is 45-75 D, more preferably 55-70 D, and most preferably 55-65 D. When the hardness is greater than 75 D, the polyurethane polishing layer has a very high removal rate, but many defects such as scratching may be accompanied. When the hardness is smaller than 45 D, the removal rate is decreased significantly, though a defect rate can be effectively reduced. The polishing layer of the disclosure obtains a good balance between the defect rate and the removal rate. The removal rate is significantly increased without increasing the defect rate (even the defect rate is reduced to some extent).

Curing Agent Composition

The curing agent composition of the disclosure is a multi-component curing agent system including an aliphatic curing agent and an aromatic curing agent. As mentioned above, apparent advantages of the multi-component curing agent system in the preparation of the polyurethane polishing layer lie in that curing agents with appropriate structures may be selected as required to respectively be used as a soft section structure and a hard section structure for adjusting a hardness of a final product, and a ratio of the soft section structure to the hard section structure of the curing agent system may be adjusted, to improve physical and chemical parameters of a polishing pad to a larger extent, such that a polishing layer applicable to different materials to be polished may be prepared.

Secondary Amine Terminated Polyether Curing Agent

In the disclosure, the aliphatic curing agent includes the secondary amine terminated polyether curing agent. An aliphatic amino has a very high activity because of a high electron cloud density, and the activity thereof is even higher than an aromatic amino. In order that different curing agents have comparable reactivity by adjusting the reactivity of each component in the multi-component curing agent system, the inventor studied the reactivity of the aliphatic amine curing agent. It is found that a secondary amine terminated polyether compound has a comparable curing reaction speed with that of a bifunctional aromatic curing agent. Therefore, a curing agent composition including the secondary amine terminated polyether curing agent and the bifunctional aromatic curing agent may be used to obtain a polishing layer with a uniform quality.

Additionally, the secondary amine terminated polyether of the disclosure is a low-viscosity liquid at a room temperature. Further, it can reduce a freezing point of the curing agent composition after being mixed with the aromatic curing agent. As such, the curing reaction may be completed at a lower temperature, which facilitates the dissipation of reaction heat, and effectively reduces the poor uniformity of the polishing layer caused by overquick heat release or nonuniform heat release.

Particularly for the polishing layer with a hollow microsphere polymer that will be described below in detail, nonuniform reaction heat release or excessively slow heat dissipation may cause nonuniform expansion of the hollow microsphere, as an expansion rate of the hollow microsphere polymer is related to a temperature, and thus a density of a polishing pad will be nonuniform. By using the low-viscosity secondary amine terminated polyether, the polishing layer of the disclosure avoids excessively high local reaction heat. Therefore, the polishing layer with the hollow microsphere polymer which has more uniform density and porosity can be obtained.

Preferably, the amine terminated polyether includes but not limited to Jeffamine® series of polyether amine from Huntsman Company, such as SD231, SD401, SD2001, ST404, HK511 and a mixture thereof, but is not limited thereto.

In some preferred examples of the disclosure, the amine terminated polyether combination includes but not limited to at least one compound selected from the following compounds represented by a general formula I and a general formula II:

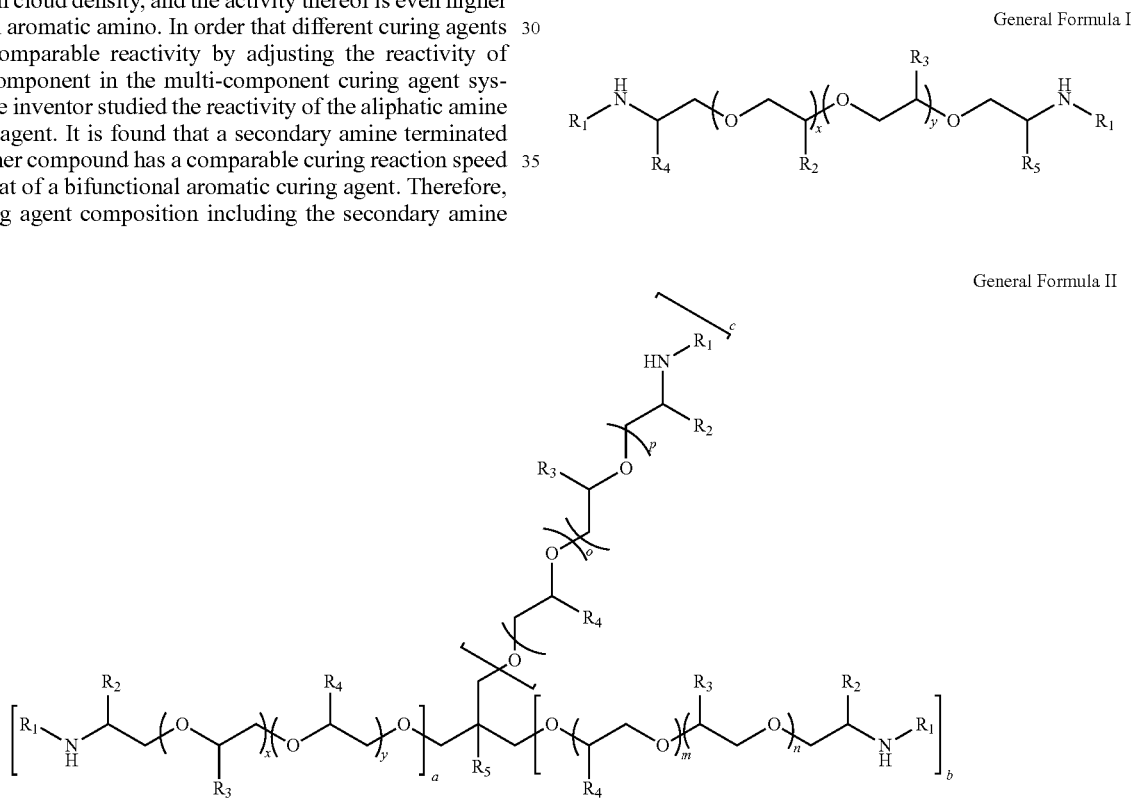

General Formula I

General Formula II

In the general formula I, $R_1$ is a C1-C8 alkyl or fluorine-containing alkyl. Each of $R_2$, $R_3$, $R_4$ and $R_5$ independently is H or C1-C8 alkyl or fluorine-containing alkyl, and x and y respectively are 0 or a positive integer, with a premise of $x+y \leq 12$.

In the general formula II, $R_1$ is a C1-C8 alkyl or fluorine-containing alkyl, each of $R_2$, $R_3$, $R_4$ and $R_5$ independently is H or a C1-C8 alkyl or fluorine-containing alkyl, a=b=c=1, and x, y, m, n, o and p respectively are 0 or a positive integer, with a premise of x+y+m+n+o+p≤12.

Preferably, in the above general formulas, $R_1$ is a C1-C4 alkyl or fluorine-containing alkyl, and each of $R_2$, $R_3$, $R_4$ and $R_5$ independently is H or C1-C4 alkyl or fluorine-containing alkyl.

The compound of the general formula I or II may further be a perfluoro-substituted compound.

More preferably, the amine terminated polyether combination includes a compound A of a following molecular structure:

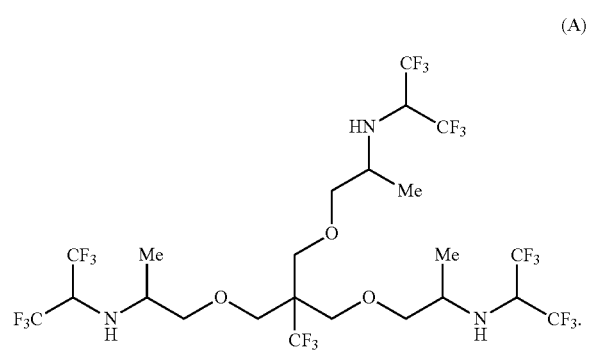 [SMILES: CC(COCC(COCC(C)NC(C(F)(F)F)C(F)(F)F)(COCC(C)NC(C(F)(F)F)C(F)(F)F)C(F)(F)F)NC(C(F)(F)F)C(F)(F)F]

(A)

The inventor surprisingly found that the polishing pad has a nearly perfect appearance and has no striation line when the above trifunctional perfluorinated secondary amine is used. The striation line refers to a nearly white irregular continuous striated line on the polishing pad (the striation may be approximately described as an irregular striation having an average width of 0.1-1.5 cm and a length of 10-50 cm). At present, a reason for forming the striation is not very clear. A possible deductive reason may be attributed to nonuniform heat release in a product, so that the microsphere is not dispersed uniformly. Such a phenomenon may cause an unexpected result produced during the polishing process, and it is likely that the polishing will be nonuniform. However, such a difference may be measured easily at a macro level.

The secondary amine terminated polyether curing agent of the disclosure may be used as a structure regulator of the soft section, and preferably has a number-average molecular weight of 250-6000.

When the molecular weight is lower than 250, the reaction of the aliphatic amine terminated polyether in the reaction process is too fast, so that the polyurethane is rapidly gelled and the operability is extremely poor. When the molecular weight of the aliphatic amine terminated polyether is greater than 6000, the activity of an amino group participating in the reaction is greatly reduced, and the polyether cannot well react with an unreacted —NCO group in the isocyanate-terminated prepolymer, which is not beneficial for a mechanical property of the polishing pad.

According to a specific requirement, the number-average molecular weight of the secondary amine terminated polyether curing agent of the disclosure may be, for example, 400-800, 1000-2000, 3000-4000, 5000-6000, 1500-2200 or 3500-5600, etc., preferably 400-800 or 1000-2000.

Aromatic Bifunctional Curing Agent

The aromatic curing agent as the structure regulator of the hard section in the disclosure is the aromatic bifunctional curing agent. The aromatic bifunctional curing agent is not particularly limited by the disclosure, and may be any appropriate aromatic bifunctional curing agents in the art. A person skilled in the art may make an appropriate selection according to a specific requirement.

Examples of the aromatic bifunctional curing agent that may be used in the disclosure include: diethyltoluenediamine (DETDA), N,N'-dialkyl diaminodiphenylmethane, 3,5-diethyl-2,4-toluenediamine and an isomer thereof (such as 3,5-diethyl-2,6-toluenediamine), 3,5-dimethylthio-2,4-toluenediamine and an isomer thereof, 4,4'-methylene-bis-(2-chloroaniline) (MOCA), 4,4'-bis-(sec-butylamino)-diphenylmethane, 1,4-bis-(sec-butylamino)-benzene, 4,4'-methylene-bis-(2-chloroani line), 4,4'-methylene-bis-(3-chloro-2,6-diethylaniline) (MCDEA), polytetramethyleneoxide-di-p-aminobenzoate, p,p'-methylene dianiline (MDA), m-phenylenediamine (MPDA), 4,4'-methylene-di-(2,6-diethylaniline) (MDEA), 4,4'-methylene-di-(2,3-dichloroaniline) (MDCA), 4,4'-diamino-3,3'-diethyl-5,5'-dimethyldiphenylmethane, 2,2',3,3'-tetrachlorodiaminodiphenylmethane, propylene glycol-di-p-aminobenzoate and a mixture thereof, but is not limited thereto.

Preferably, the aromatic bifunctional curing agent is selected from 4,4'-methylene-bis-(2-chloroaniline) (MOCA), 4,4'-methylene-bis-(3-chloro-2,6-diethylaniline) (MCDEA) and an isomer thereof.

More preferably, the aromatic bifunctional curing agent is MOCA. A unique chemical structure of the MOCA may guarantee an appropriate operating time during preparing the polishing pad and the obtained polishing pad having good polishing properties.

By combining the aliphatic polyamine curing agent and the aromatic polyamine curing agent in the multi-component curing agent system of the disclosure and making the aliphatic curing agent and the aromatic curing agent have very close reactivity, the polyurethane polishing layer with an improved uniformity may be obtained. Therefore, such a polyurethane polishing layer can be better applied to an advanced semiconductor process, particularly a process in which the characteristic size is 28 nm or below.

In the multi-component curing agent system of the disclosure, a mass ratio of the aliphatic secondary amine terminated polyether curing agent to the aromatic bifunctional composition is 1:4-4:1. When the content of the aliphatic secondary amine terminated polyether in the curing agent composition is lower than 20 wt %, the effect for reducing a melting point of the curing agent composition is not significant. When the content of the secondary amine terminated polyether in the curing agent composition is higher than 80 wt %, the polyurethane polishing layer obtained by curing may be soft, and the planarization capacity is reduced.

Since the reactivity of the secondary amine terminated polyether curing agent and the aromatic bifunctional curing agent are similar, an ideal balance between the removal rate and the defect rate can be obtained finally. Therefore, with respect to the first aspect of the disclosure, more secondary amine terminated polyether compound of the soft section may be added, and thus the polishing layer having a wider hardness range may be obtained.

Isocyanate-Terminated Prepolymer

In the disclosure, the isocyanate-terminated prepolymer is obtained by a reaction of a polyfunctional isocyanate and a polyether polyol. Preferably, the prepolymer has two terminal —NCO groups. More preferably, the prepolymer is a polyether-based isocyanate-terminated carbamate prepolymer.

In the raw materials for preparing the isocyanate-terminated prepolymer, the polyfunctional isocyanate includes but not limited to one or two of aromatic isocyanates and aliphatic isocyanates. Preferably, the aromatic isocyanate is used in an amount of 90 mol % or above, more preferably 95 mol % or above, and particularly preferably 100 mol % or above.

Preferably, the aromatic isocyanate includes but not limited to aromatic diisocyanates. The aromatic diisocyanates include but not limited to one or more of 2,4-toluene diisocyanate, 2,6-toluene diisocyanate, 2,2'-diphenylmethane diisocyanate, 2,4'-diphenylmethane diisocyanate, 4,4'-diphenylmethane diisocyanate, 1,5-naphthalene diisocyanate, p-phenylene diisocyanate, m-phenylene diisocyanate, terephthalylidene diisocyanate, and isophthalylidene diisocyanate.

Preferably, the aliphatic isocyanate includes but not limited to aliphatic diisocyanates. The aliphatic isocyanates include but not limited to one or more of ethylidene diisocyanate, 2,2,4-trimethyl hexamethylene diisocyanate, and 1,6-hexamethylene diisocyanate. Further, the aliphatic isocyanates may be alicyclic diisocyanates. The alicyclic isocyanates include but not limited to one or more of 1,4-cyclohexyl diisocyanate, 4,4'-dicyclohexylmethane diisocyanate, isophorone diisocyanate, and norbornane diisocyanate.

In the raw materials for preparing the isocyanate-terminated prepolymer, the polyether polyols may be polyether-based high molecular weight polyols.

Preferably, the polyether polyols include but not limited to any one of, or a copolymer of two or more of, or a mixture of two or more of polytetramethylene ether glycol (PT-MEG), polyethylene glycol (PEG), polypropylene glycol (PPG), and polytetramethylene ether glycol-polyethylene glycol, polytetramethylene ether glycol-polypropylene glycol and polyethylene glycol-polypropylene glycol.

As an optional example, a number-average molecular weight of the polyether polyol may be 500-5000. For example, the number-average molecular weight of the polyether polyol may be 500-2000, or 500-1500 as required. It is to be noted that when the polyether polyol having the number-average molecular weight smaller than 500 is used, the obtained polyurethane resin does not have an sufficient elastic characteristic, and tends to be a fragile polymer. The polishing pad formed by the foregoing polyurethane resin (the fragile polymer) may be excessively hard, and may be a reason for the occurrence of scratching on the surface of an object being polished. Moreover, such a polishing pad is easily worn to shorten a service life of a grinding point. When the polyether polyol having the number-average molecular weight greater than 5000 is used, the polishing pad prepared by the polyurethane resin obtained thereby may be soft, and it may be difficult to obtain a fully satisfactory planarity.

In the disclosure, preferably, the isocyanate-terminated prepolymer may be a commercially-available prepolymer obtained by a reaction of polyether with TDI and MDI. The isocyanate-terminated prepolymer includes but not limited to LF800A, LF900A, LF910A, LF930A, LF931A, LF939A, LF950A, LF952A, LF600D, LF601D, LF650D, LF667D, LF700D, LF750D, LF751D, LF752D, LF753D, L325, LFG963A, LFG964A and LFG740D of Adiprene® series produced by Chemtura Company.

In the disclosure, the isocyanate-terminated prepolymer comprises 5.5-9.5 wt % of unreacted isocyanate groups (—NCO). Preferably, a content of the unreacted —NCO is controlled at 5.5-9.5 wt %. More preferably, the content of the unreacted —NCO is 6.5-9.2 wt %.

Hollow Microsphere Polymer

The polyurethane polishing layer prepared with the hollow microsphere polymer is a polishing layer applicable to chemical-mechanical polishing work. The prepared polyurethane polishing layer may have a porous structure or a nonporous structure, which is not particularly limited by the disclosure.

As an optional example, in a preparation process of the polyurethane polishing layer, the hollow microsphere polymer is uniformly dispersed in the polishing layer, to adjust a polishing effect of the polyurethane polishing layer.

The term "hollow microsphere polymer" in the disclosure is an expandable hollow polymer microsphere, which may be expanded appropriately by virtue of an increased temperature caused by the reaction heat released during the curing process. By adjusting distribution (such as a density) of the hollow microsphere polymer in the polyurethane polishing layer in combination with adjusting a particle size of the hollow microsphere polymer, the polishing property of the polishing layer may further be adjusted. Preferably, the final polishing layer may have a porosity of 10-40% and a pore diameter of <120 μm, more preferably, have a porosity of 15-35% and a pore diameter of <50 μm, by dispersing the hollow microsphere polymer in the polishing layer.

Preferably, the hollow microsphere polymer has but not limited to a saclike structure with an outer wall of polyacrylonitrile and polyacrylonitrile copolymer. The hollow microsphere polymer may be a microsphere or a microbead available from any company of Akzo Nobel, Matsumoto Yushi-Seiyaku Co. LTD or Sekisui Chemical Industrial Co. LTD, preferably a hollow microsphere of Expancel series from Akzo Nobel or a microbead of F series from Matsumoto.

Other Additives

In the disclosure, an appropriate modifying material may further be added to the polyurethane polishing layer, to obtain a more excellent improvement in an overall property.

These modifying materials include but not limited to: an antioxidant, a wear-resistant filler, and a storage stabilizer, etc.

Endpoint Detection Window

In the disclosure, based on an actual requirement, a structure of the polyurethane polishing layer may be further improved so that the practicability is more enhanced.

As an optional example, at least one endpoint detection area is formed in the polyurethane polishing layer. During polishing work, the endpoint detection area of the polyurethane polishing layer can be used for high-precision optical endpoint detection. A detection method may be, for example, optical detection. As the endpoint detection area is made from an appropriate material, it has an appropriate light transmittance, so as to observe an object (such as a silicon wafer) being polished. Preferably, the material forming the endpoint detection area has a light transmittance of ≥40% within an overall wavelength range of 300-800 nm. More preferably, the light transmittance of a high transmittance material is ≥60%.

Preferably, the material of the endpoint detection area includes but not limited to one or more of thermosetting resins, such as polyurethane resins, polyester resins, phenolic resins, urea resins, melamine resins, epoxy resins and acrylic resins; and thermoplastic resins, such as polyurethane resins, polyester resins, polyamide resins, cellulose resins, acrylic resins, polycarbonate resins, halogen-containing resins (polyvinyl chloride, polytetrafluoroethylene, polyvinylidene fluoride, etc.), polystyrene and olefin resins (polyethylene, polypropylene, etc.).

Preferably, during grinding, the Shore hardness of the endpoint detection area is 40-65 D, and more preferably 45-55 D. When the Shore hardness of the endpoint detection area is smaller than 40 D, the area tends to be creepage, and it is difficult to stably carry out the optical endpoint detection. When the Shore hardness is greater than 75 D, scratching tends to occur on a surface of a material being polished.

Preferably, in the disclosure, the hardness of the endpoint detection area should be matched with that of the polishing layer. An absolute value of a hardness difference between the endpoint detection area and the polishing layer should be 5 or less, so that the endpoint detection area and the polishing layer have similar wear rates during grinding. If the hardness of the endpoint detection area is higher than that of a polishing pad body and the difference is greater than 5, the defects such as scratching on the object being ground caused by the harder endpoint detection area are more than those caused by the polishing pad body, such that the polishing pad has a high defect rate. If the hardness of the endpoint detection area is lower than that of the polishing pad body and the difference is greater than 5, the endpoint detection area having the lower hardness has a faster wear rate and tends to be depressed. That is to say, a service life of the endpoint detection area is shorter than that of the polishing pad body. As a result, the overall service life of the polishing pad is shortened, and the use cost is increased. Preferably, the hardness of the endpoint detection area should be matched with that of the polishing layer, and the absolute value of the hardness difference therebetween should be 3 or less.

Groove

In the disclosure, the groove may be disposed on the polyurethane polishing layer according to a common practice in the art. The groove is configured to receive a polishing solution in a polishing process. The groove may be formed after the polishing pad is prepared. By providing the groove, the polishing solution used in the polishing process can be released and flow smoothly. Preferably, the groove is one or more of a concentric groove (for example, it may be an annular groove or a spiral groove), a curved groove, a grid line groove, a regular polygonal groove (for example, a hexagon and a triangle), and a groove with a tire tread type pattern. More preferably, the groove is one or more of the annular groove, the spiral groove, an X-Y grid groove, a hexagonal groove, a triangular groove and a fractal groove. More preferably, a cross section of the groove is one or more of a rectangle with vertical sidewalls, a "V" shape, a "U" shape and a zigzag shape. Further preferably, the groove is the annular groove and/or the grid line groove.

Preferably, the groove has a width of 0.1-0.6 cm. More preferably, the groove has a width of 0.2-0.4 cm.

Buffer Pad

In the disclosure, a buffer pad is further disposed on a back of the polyurethane polishing layer. The buffer pad can alleviate impact applied to the polishing pad in a polishing process.

Preparation Method of Polishing Layer

The disclosure further provides a preparation method of the above-mentioned polishing layer. The preparation method of the polishing layer provided by the present disclosure may be a casting and curing process commonly used in the art. The preparation method includes the following steps.

(1) Optionally, a casting composition, from which an endpoint detection area having a corresponding hardness can be prepared, is cast into an inner cavity of a mould, followed by curing, demoulding and surface sanding, to obtain a cylindrical block.

(2) The cylindrical block obtained in the optional step (1) is placed into an annular sidewall of a polishing layer mould; and a raw material combination of a polishing layer, from which a polishing area having a corresponding hardness can be prepared, is cast into the annular inner cavity, followed by curing, demoulding and surface sanding to obtain a cylindrical cured block.

(3) The cured block is sliced, to obtain the polishing layer that is integrally formed and has an endpoint detection area.

(4) Optionally, a groove is formed on the polishing layer.

In the disclosure, in the step (1), the curing preferably includes the following processes: gelling, raising temperature, curing and cooling. The gelling temperature is preferably 65-75° C., and may be, for example, 70° C. The gelling time is preferably 10-20 min, and may be, for example, 15 min. The temperature during the raising temperature is preferably raised to 90-110° C., and may be, for example, 100° C. The duration for the raising temperature is preferably 20-40 min, and may be, for example, 30 min. The curing time is preferably 15-17 h, and may be, for example, 16 h. The temperature during cooling is preferably cooled to 15-30° C., and may be, for example, 25° C.

In the disclosure, in the step (2), the curing preferably includes the following processes: gelling, raising temperature, curing and cooling. The gelling temperature is preferably 65-75° C., and may be, for example, 70° C. The gelling time is preferably 10-20 min, and may be, for example, 15 min. The temperature during raising temperature is preferably raised to 90-110° C., and may be, for example, 100° C. The duration for the raising temperature is preferably 20-40 min, and may be, for example, 30 min. The curing time is preferably 15-17 h, and may be, for example, 16 h. The temperature during cooling is preferably cooled to 15-30° C., and may be, for example, 25° C.

In the steps (1)-(2), the curing preferably includes the following processes: gelling, raising temperature, curing and cooling. The gelling temperature is 70° C. The gelling time is 15 min. The temperature during raising temperature is raised to 100° C. The duration for raising temperature is 30 min. The curing time is 16 h, and the temperature during cooling is cooled to 25° C.

Polishing Treatment

Again, the schematic diagram of polishing treatment by using a chemical-mechanical polishing pad having the above-mentioned polishing layer may refer to FIG. 1, and is not repeated herein.

The curing agent composition, the polyurethane polishing layer and the polishing pad of the disclosure are further described below in detail in combination with Examples.

EXAMPLES

Methods for measuring the following involved physical and chemical parameters are as follows.

Shore hardness: being measured according to an ASTM D 2240 method.

Density: being calculated according to the following formula: $S \cdot G = m/v = m/(\pi(d/2)^2 * h)$, where m is a weight of a polishing pad, d is a diameter of the polishing pad, and h is a thickness of the polishing pad.

Compression rate: being calculated according to the following formula: compression rate=$((T1-T2)/T1)*100\%$, where T1 is a thickness of a sheet when a pressure of 30 kpa is applied to the polishing pad for 60 s from a load-free state, and T2 is a thickness of the sheet when a pressure of 180 kpa is applied to the polishing pad for 60 s from the T1 state.

Elongation at break: referring to GB T 6344-2008.

Coefficient of thermal expansion: referring to ASTM D1903-1996.

Example 1

This example provides a polishing layer. A preparation method for the polishing layer is as follows.

At Step 1: an isocyanate-terminated polycarbamate prepolymer (or referred to as a prepolymer) was treated.

100 parts by mass of an isocyanate-terminated prepolymer (comprising 8.75-9.05% of unreacted —NCO groups) obtained by a reaction of toluene diisocyanate and polytetrahydrofuran were heated to 80° C., and then degassed in vacuum (~0.095 MPa) for 2 h, so that gas and a small molecular compound in the prepolymer were removed. Then, 0.77 parts by mass of a hollow microsphere polymer having an average diameter of 40 μm were added. The hollow microsphere polymer was uniformly dispersed in the prepolymer by stirring, followed by degassing in vacuum (~0.095 MPa) for 2 h again. Then the mixture was cooled to 50° C. for later use.

At Step 2: a curing agent composition was formulated.

23.27 parts by mass of MOCA were heated to 116° C. to be completely melted into a clear and transparent liquid, and 5.92 parts by mass of amine-terminated polyoxypropylene ether D2000 were added therein. The MOCA and the amine-terminated polyoxypropylene ether D2000 were mixed uniformly by stirring to form a uniform transparent liquid, and then the liquid was cooled to 70° C. for later use.

At Step 3: the curing agent composition was used to cure the prepolymer comprising the hollow microsphere polymer.

The prepolymer and the curing agent composition were mixed under high-speed shearing, and then cast into a cylindrical mould to form a castable having a thickness of 12 cm. The castable was gelled for 15 min at 70° C., and then heated to 100° C. within 30 min, and cured for 16 h. After being cured, the castable was cooled to a room temperature automatically in an oven. The cured casting block was cut from top to bottom into sheets having a thickness of 2 mm. 60 sheets were obtained in total and numbered as 1-60 from top to bottom in sequence.

A polishing layer sheet numbered as 15 was taken to respectively measure a density, a hardness, an elongation at break and an expansion coefficient according to the above methods.

The raw materials, the amounts and physical and chemical properties thereof are summarized in Table 1 and Table 2. The amounts of all raw materials are in parts by mass.

Comparative Example 1

This comparative example provides a polishing layer. The preparation method of this polishing layer is as follows.

At Step 1: an isocyanate-terminated polycarbamate prepolymer (hereinafter referred to as a prepolymer) was treated.

100 parts by mass of an isocyanate-terminated prepolymer (comprising 8.75-9.05% of unreacted —NCO groups) obtained by a reaction of toluene diisocyanate and polytetrahydrofuran were heated to 80° C., and then degassed in vacuum (~0.095 MPa) for 2 h, so that gas and a small molecular compound in the prepolymer were removed. Then, 0.77 parts by mass of a hollow microsphere polymer having an average diameter of 40 μm were added. The hollow microsphere polymer was uniformly dispersed in the prepolymer by stirring, followed by degassing in vacuum (~0.095 MPa) for 2 h again. Then the mixture was cooled to 50° C. for later use.

At Step 2: a curing agent was formulated.

28.32 parts by mass of MOCA were heated to 116° C. to be completely melted into a clear and transparent liquid for later use.

At Step 3: the curing agent was used to cure the prepolymer containing the hollow microsphere polymer.

The prepolymer and the curing agent were mixed under high-speed shearing, and then cast into a cylindrical mould to form a castable having a thickness of 12 cm. The castable was gelled for 15 min at 70° C., then heated to 100° C. within 30 min, and cured for 16 h. After being cured, the castable was cooled to a room temperature automatically in an oven. The cured casting block was cut from top to bottom into sheets having a thickness of 2 mm. 60 sheets were obtained in total and numbered as 1-60 from top to bottom in sequence.

A polishing layer sheet numbered as 15 was taken to respectively measure a density, a hardness, an elongation at break and an expansion coefficient according to the above methods.

The raw materials, the amounts and physical and chemical properties thereof are summarized in Table 1 and Table 2. The amounts of all raw materials are in parts by mass.

Testing Example 1: Evaluation of density uniformity of the polishing layers

Experimental method 1: the polishing layer sheets obtained in Example 1 and Comparative Example 1 were respectively recorded as a first group and a second group. The sheets in the first group and the second group were respectively numbered as 1-60 from top to bottom. The Shore density of each sheet was tested, and the results are summarized in FIG. 2.

Experimental method 2: the middlemost sheets in Example 1 and Comparative Example 1, namely, the sheets numbered as 29, were taken. Along a radius direction, from a center to an edge, small round sheets having a diameter of 4 cm were respectively taken and numbered as 1-10 in sequence. The Shore density of each small round sheet was tested, and the results are summarized in FIG. 3.

Figure 2:
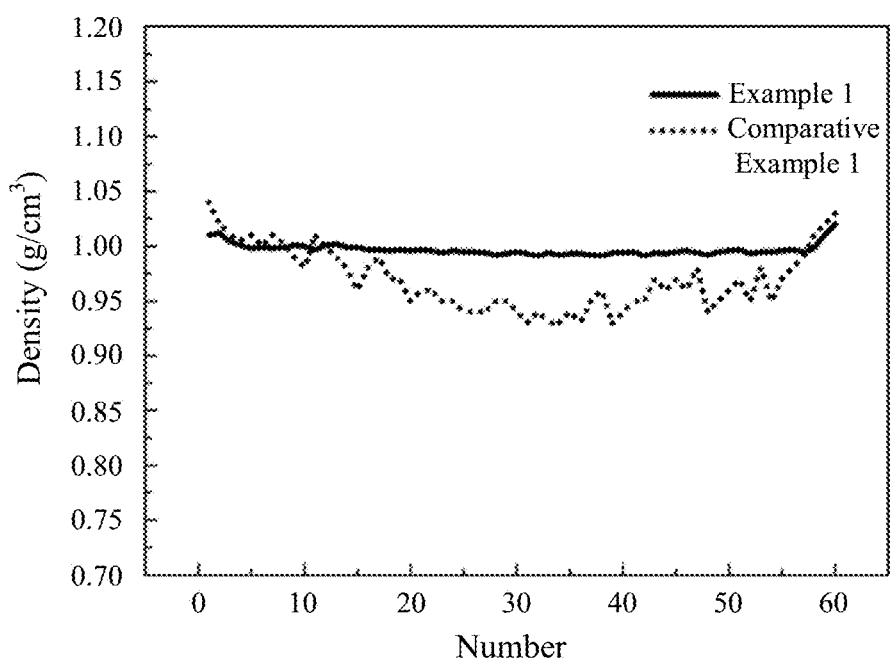
FIG. 2 is a diagram for comparing density distribution of the polishing layers respectively provided by Example 1 and Comparative Example 1.
Figure 3:
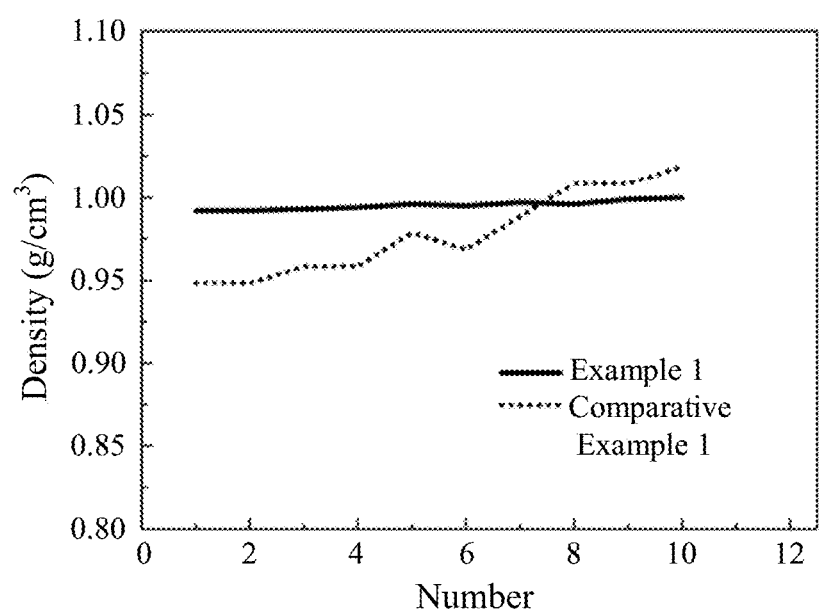
FIG. 3 is a diagram for comparing radial density distribution of a single polishing layer which is respectively provided by Example 1 and Comparative Example 1.

By analyzing FIG. 2 and FIG. 3, the following results may be obtained.

In FIG. 2, a density distribution of Comparative Example 1 has a "smiling curve" in which the middle part is low and the two ends are high. This is because it is more difficult for the middle part to release heat during the reaction after casting, so that the temperature in the middle part is higher than that of the two ends. As a result, the polyurethane body and the hollow microsphere polymer are expanded to a certain level, and thereby the density is low. In Example 1, since the initial temperature of the curing agent composition is reduced, the heat in the reaction process of the polyurethane can be released uniformly and smoothly. Although the density in the middle part is slightly lower than that of the two ends, the expansion of the polyurethane body and the hollow microsphere polymer is effectively suppressed, and thus the density curve is straighter.

In the radial density distribution shown in FIG. 3, the density of sheets in both Comparative Example 1 and Example 1 becomes lower when closing to the center and becomes higher when closing to the edge. However, the density uniformity in Example 1 is far superior to that of Comparative Example 1, which is also attributed to the low initial reaction temperature. To sum up, by using the curing agent composition with a lower temperature, the process of acutely releasing heat during the reaction is effectively suppressed, and the polishing layer with a better density uniformity may be obtained.

Examples 2-11

Through the same process as Example 1, polishing layers having different effects may be obtained by selecting different types of aliphatic diamines, prepolymers having different —NCO contents, hollow microsphere polymers having different average diameters, and different chain extension coefficients. The raw materials, amounts and physical and chemical properties thereof are summarized in Table 1 and Table 2. The amounts of all raw materials are in parts by mass.

Comparative Example 2

This example provides a polishing layer. The preparation method of this polishing layer is as follows.

The isocyanate-terminated polycarbamate prepolymer (hereinafter referred to as a prepolymer) was treated as follows. 100 parts by mass of the isocyanate-terminated prepolymer (comprising 8.75-9.05% of unreacted —NCO groups) obtained by a reaction of toluene diisocyanate and polytetrahydrofuran were heated to 80° C., and then degassed in vacuum (~0.095 MPa) for 2 h, so that gas and a small molecular compound in the prepolymer were removed. Then, 0.77 parts by mass of a hollow microsphere polymer having an average diameter of 40 μm were added. The hollow microsphere polymer was uniformly dispersed in the prepolymer by stirring, followed by degassing in the vacuum (~0.095 MPa) for 2 h again. Then the mixture was cooled to 50° C. for later use.

TABLE 1

Raw material compositions of polyurethane polishing layers in Examples 1-11 and Comparative Example 1

| | | Formula | | | | | | |
|---|---|---|---|---|---|---|---|---|
| | | Curing agents | | | | | Microspheres | |
| | | Components | | | | Chain extension | | |
| Examples | Prepolymer | MOCA | D2000 | ED2003 | ED900 | coefficient | 20 μm | 40 μm |
| 1 | 100 | 23.27 | 5.92 | | | 1.05 | | 0.77 |
| 2 | 100 | 22.40 | 4.0 | | | 1.08 | 1.39 | |
| 3 | 100 | 21.12 | 8.8 | | | 1.06 | 1.43 | |
| 4 | 100 | 19.94 | 13.2 | | | 1.06 | 1.46 | |
| 5 | 100 | 22.40 | 4.0 | | | 1.09 | | 0.77 |
| 6 | 100 | 22.40 | 4.0 | | | 1.08 | | 1.26 |
| 7 | 100 | 22.40 | | 4.0 | | 1.05 | | 1.89 |
| 8 | 100 | 22.40 | | 4.0 | | 1.07 | | 2.53 |
| 9 | 100 | 22.40 | | | 4.0 | 1.08 | | 3.79 |
| 10 | 100 | 23.46 | 20.0 | | | 1.04 | 3.81 | |
| 11 | 100 | 23.46 | 2.0 | | | 1.10 | 0.50 | 2.53 |
| Comparative Example 1 | 100 | 28.32 | | | | 0.85 | | 0.77 |

TABLE 2

Physical and chemical properties of polyurethane polishing layers in Examples 1-11 and Comparative Example 1

| | Testing result | | | |
|---|---|---|---|---|
| Examples | Density (g/cm$^3$) | Hardness (D) | Elongation at break (%) | Coefficient of thermal expansion (ppm/° C.) |
| 1 | 0.6 | 46 | 446 | 144 |
| 2 | 1.023 | 60 | 183 | 108 |
| 3 | 1.015 | 58 | 292 | 140 |
| 4 | 1.011 | 55 | 415 | 108 |
| 5 | 1.002 | 61 | 127 | 112 |
| 6 | 0.913 | 59 | 200 | 173 |
| 7 | 0.824 | 58 | 295 | 186 |
| 8 | 0.746 | 57 | 305 | 199 |
| 9 | 0.6 | 55 | 403 | 197 |
| 10 | 0.789 | 45 | 450 | 200 |
| 11 | 1.1 | 70 | 50 | 100 |
| Comparative Example 1 | 0.4 | 43 | 506 | 208 |

The curing agent composition was formulated as follows. 23.46 parts by mass of MOCA were heated to 116° C. to be completely melted into a clear and transparent liquid, and 5 parts by mass of amine-terminated polyoxypropylene ether D2000 were added therein. The MOCA and the amine-terminated polyoxypropylene ether D2000 were mixed uniformly by stirring to form a uniform transparent liquid, and then the liquid was cooled to 70° C. for later use.

The prepolymer and the curing agent composition were mixed under high-speed shearing, and then cast into a cylindrical mould to form a castable having a thickness of 12 cm. The castable was gelled for 15 min at 70° C., then heated to 100° C. within 30 min, and cured for 16 h. After being cured, the castable was cooled to a room temperature automatically in an oven. The cured casting block was cut from top to bottom into sheets having a thickness of 2 mm. 60 sheets were obtained in total and numbered as 1-60 from top to bottom in sequence.

A polishing layer sheet numbered as 15 was taken to respectively measure a density, a hardness, an elongation at break and an expansion coefficient according to the above methods.

The raw materials, the amounts and physical and chemical properties thereof are summarized in Table 3 and Table 4. The amounts of all raw materials are in parts by mass.

Example 12

This example provides a polishing layer. The preparation method of this polishing layer is as follows.

The isocyanate-terminated polycarbamate prepolymer (hereinafter referred to as a prepolymer) was treated as follows.

100 parts by mass of the isocyanate-terminated prepolymer (comprising 8.75-9.05% of unreacted —NCO groups) obtained by a reaction of toluene diisocyanate and polytetrahydrofuran were heated to 80° C., and then degassed in vacuum (~0.095 MPa) for 2 h, so that gas and a small molecular compound in the prepolymer were removed. Then, 0.77 parts by mass of a hollow microsphere polymer having an average diameter of 40 μm were added. The hollow microsphere polymer was uniformly dispersed in the prepolymer by stirring, followed by degassing in vacuum (~0.095 MPa) for 2 h again. Then the mixture was cooled to 50° C. for later use.

The curing agent composition was formulated as follows. 23.46 parts by mass of MOCA were heated to 116° C. to be completely melted into a clear and transparent liquid, and then 4 parts of amine-terminated polyoxypropylene ether D2000 and 1 part by mass of trifunctional polyetheramine T5000 were added therein. The mixture was mixed uniformly by stirring to form a uniform transparent liquid, and then the liquid was cooled to 70° C. for later use.

The prepolymer and the curing agent composition were mixed under high-speed shearing, and then cast into a cylindrical mould to form a castable having a thickness of 12 cm. The castable was gelled for 15 min at 70° C., and then heated to 100° C. within 30 min, and cured for 16 h. After being cured, the castable was cooled to a room temperature automatically in an oven. The cured casting block was cut from top to bottom into sheets having a thickness of 2 mm. 60 sheets were obtained in total and numbered from top to bottom in sequence.

A polishing layer sheet numbered as 15 was taken to respectively measure a density, a hardness, an elongation at break and an expansion coefficient according to the above methods.

The raw materials, the amounts and physical and chemical properties thereof are summarized in Table 1 and Table 2. The amounts of all raw materials are in parts by mass.

Examples 13-20

Through the same process as Example 12, a series of polishing pads having different crosslinking degrees may be obtained by adjusting the ratio of the aliphatic diamines to the polyamines without changing the total amounts of the aliphatic diamines and the polyamines. The raw materials, the amounts and physical and chemical properties are summarized in Table 3 and Table 4.

TABLE 3

Raw material compositions of polyurethane polishing layers in Examples 12-20 and Comparative Example 2

| | Formula | | | | | |
|---|---|---|---|---|---|---|
| | | Curing agents | | | Chain extension coefficient | Microsphere 40 μm |
| Items Examples | Prepolymer | MOCA | D2000 | T5000 | | |
| 12 | 100 | 23.46 | 4 | 1 | 1.15 | 0.77 |
| 13 | 100 | 23.46 | 4.7 | 0.3 | 1.14 | 0.78 |
| 14 | 100 | 23.46 | 4.5 | 0.5 | 1.13 | 0.78 |
| 15 | 100 | 23.46 | 4.3 | 0.7 | 1.03 | 0.78 |
| 16 | 100 | 23.46 | 4.1 | 0.9 | 1.17 | 0.78 |
| 17 | 100 | 23.46 | 3.9 | 1.1 | 1.15 | 0.78 |
| 18 | 100 | 23.46 | 3.5 | 1.5 | 1.08 | 0.78 |
| 19 | 100 | 23.46 | 3 | 2 | 1.09 | 0.78 |
| 20 | 100 | 23.46 | 2.5 | 2.5 | 1.2 | 0.78 |
| Comparative Example 2 | 100 | 23.46 | 5 | | 1.07 | 0.77 |

TABLE 4

Physical and chemical properties of polyurethane polishing layers in Examples 12-20 and Comparative Example 2

| | Testing result | | | |
|---|---|---|---|---|
| Items Examples | Density (g/cm$^3$) | Hardness (D) | Elongation at break (%) | Coefficient of thermal expansion (ppm/° C.) |
| 12 | 1.019 | 59 | 216 | 137 |
| 13 | 1.023 | 60 | 171 | 132 |
| 14 | 1.015 | 59 | 203 | 129 |
| 15 | 1.011 | 62 | 73 | 125 |
| 16 | 1.002 | 58 | 271 | 120 |
| 17 | 1.032 | 56 | 334 | 115 |
| 18 | 1.028 | 56 | 336 | 111 |
| 19 | 1.021 | 57 | 318 | 99 |
| 20 | 1.037 | 61 | 102 | 140 |
| Comparative Example 2 | 1.008 | 49 | 400 | 100 |

Testing Example 2: Evaluation of Hydrolytic Resistance

Experimental method: polishing layers numbered as 15 in Examples 13-20 and Comparative Example 2 were taken. Round sheets having a diameter of 127 mm were cut from the respective polishing layers. Then, the round sheets were immersed in a hydrochloric acid solution having pH=2 and a sodium hydroxide solution having pH=12 for 80 h, followed by measuring the sizes thereof. A change in size of each round sheet was calculated, and the results are summarized in Table 5.

TABLE 5

Hydrolytic resistance of polishing layers in Examples 13-20 and Comparative Example 2

| | | Initial diameter (mm) | Diameter after 80 h (mm) | | Diameter change rate (%) | |
|---|---|---|---|---|---|---|
| Items | | | HCl solution | NaOH solution | HCl solution | NaOH solution |
| Examples | 13 | 127.1 | 127.9 | 128.1 | 0.63 | 0.79 |
| | 14 | 126.9 | 127.6 | 127.8 | 0.55 | 0.71 |

TABLE 5-continued

Hydrolytic resistance of polishing layers in Examples 13-20 and Comparative Example 2

| Items | Initial diameter (mm) | Diameter after 80 h (mm) | | Diameter change rate (%) | |
|---|---|---|---|---|---|
| | | HCl solution | NaOH solution | HCl solution | NaOH solution |
| 15 | 127.1 | 127.8 | 127.8 | 0.55 | 0.55 |
| 16 | 127.0 | 127.6 | 127.7 | 0.47 | 0.55 |
| 17 | 127.1 | 127.6 | 127.6 | 0.39 | 0.39 |
| 18 | 127.0 | 127.5 | 127.6 | 0.39 | 0.47 |
| 19 | 126.9 | 127.3 | 127.4 | 0.32 | 0.39 |
| 20 | 127.0 | 127.2 | 127.3 | 0.16 | 0.24 |
| Comparative Example 2 | 127.1 | 128.1 | 128.6 | 0.79 | 1.18 |

As can be seen from Table 4, with the increase of the crosslinking density of the polishing layer, the coefficient of thermal expansion shows an obvious reduction trend. Moreover, the higher the content of the polyamine composition, the smaller the coefficient of thermal expansion.

As can be seen from Table 5, from Examples 13 to 20, with the increase of a content of the polyamine composition in the formula, the hydrolytic resistance to an acid or an alkali is greatly improved, and the diameter change rate is smaller than that of Comparative Example 2, which indicates that the hydrolytic resistance of the polishing pad can also be improved to a certain extent even in case of a lower crosslinking degree (Example 13).

Testing Example 3: Evaluation of Removal Rates of the Polishing Layers

Experimental method: polishing pads were prepared from polishing layers obtained from the same part in Examples 13, 16, 19 and Comparative Example 2. By testing on a machine, polishing properties were evaluated. Testing conditions were as follows.

A testing machine table was AMAT Refeixion (Modify 5 Zone).

A polishing solution was ANJI 3060 (diluted at 1:9, $H_2O_2\%=1\%$), with a flow rate of 250 mL/min.

A trimming plate was Saesol Disk 6045C4, P/C down-force 5 lbf, Head & Platen RPM: 93/87.

A wafer was a Pattern wafer: Semitech 754, Cu Blanket wafer Pre Thickness 10 KA.

Figure 4:
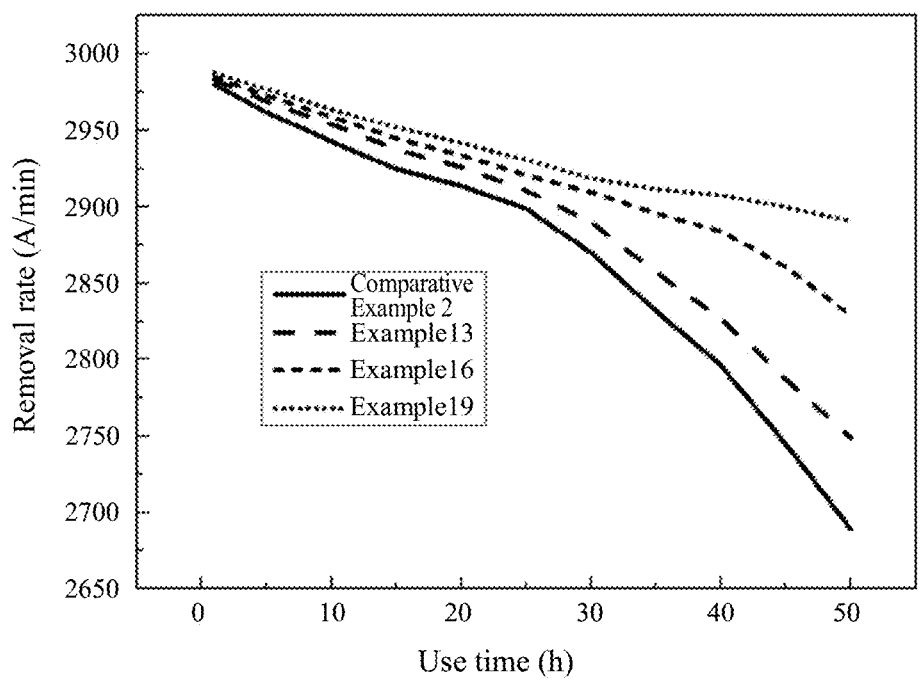
FIG. 4 is a diagram for comparing service lives of the polishing layers provided by Comparative Example 2 and Examples 13, 16, 19.

A change in removal rate in a life cycle was recorded during grinding, and the results are summarized in FIG. 4.

By analyzing FIG. 4, the removal rate of the polishing pad shows an apparent reduction trend over the grinding time. However, for a system having a higher crosslinking density, the removal rate is reduced slowly.

Testing Example 4: Evaluation of Service Lives of the Polishing Layers

Experimental method: polishing pads were prepared from the polishing layers obtained in Examples 13-20 and Comparative Example 2. By cutting with the trimming plate for a long-time, an extreme service life was tested, that is, a time required to completely flat the grooves having same parameters. The results are summarized in Table 6.

TABLE 6

Service life of the polishing layers

| | Examples | | | | | | | | Comparative |
|---|---|---|---|---|---|---|---|---|---|
| No. | 13 | 14 | 15 | 16 | 17 | 18 | 19 | 20 | Example 2 |
| Service life (h, hours) | 39.0 | 39.5 | 38.8 | 38.5 | 35.1 | 32.2 | 29.3 | 25.8 | 40.0 |

The following results may be obtained from Table 6.

When the crosslinking density is low, the service life has no significant difference. However, when the crosslinking density is increased up to a certain level, an elasticity of the polishing pad becomes insufficient. In particular, the polishing pad tends to be fragile and the service life is shortened gradually. Considering both the removal rate and the service life, it is a better choice that the amount of the polyamine curing agent is 1.5-3.5%.

Testing Example 5

During processing of a silicon wafer, the number of chips that a wafer can be cut into is closely related to the surface flatness of the wafer. The flatter the surface, the more the number of chips that a same wafer can be cut into. However, in an actual polishing process, grinding rates for polishing the wafer by a polishing pad are not completely same for each area due to an edge effect. In particular, the removal rate shows an obvious reduction trend when the polishing pad gets close to an edge of the wafer.

Figure 5:
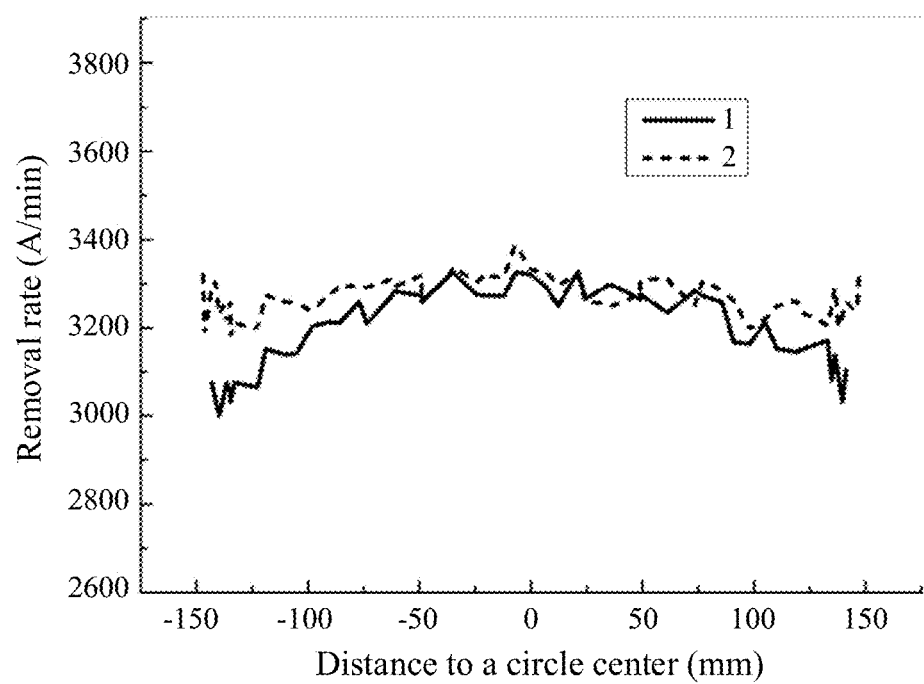
FIG. 5 is a diagram for comparing removal rates when a polishing pad prepared with a polyurethane polishing layer in Example 12 and a commercially-available polishing pad are used to carry out polishing work.

As shown in FIG. 5, a horizontal coordinate represents a distance to the center of the wafer, and a longitudinal coordinate represents a removal rate during a grinding process. The curve 1 is obtained by using a polishing pad with a trade mark IC1010 from Dow Company. The curve 2 is obtained by using the polishing pad prepared with the polishing layer in Example 12 of the disclosure. FIG. 5 shows the removal rate for grinding the wafer as a function of a distance to the center of the wafer.

As can be seen from FIG. 5, during polishing a 300 mm wafer, a polishing rate is significantly reduced when the distance to the center of the wafer is greater than 50 mm, as shown in the curve 1. However, it is surprisingly found that a grinding characteristic is excellent and the edge effect is significantly suppressed, by using the polishing pad prepared in Example 12 of the disclosure (the curve 2 in FIG. 5).

Example 21

This example provides a polyurethane polishing layer. The preparation method of this polishing layer is as follows.

At Step 1: an isocyanate-terminated polycarbamate prepolymer (or referred to as a prepolymer) was treated.

100 parts by mass of an isocyanate-terminated prepolymer (comprising 8.75-9.05% of unreacted —NCO groups) obtained by a reaction of toluene diisocyanate and polytetrahydrofuran were heated to 80° C., and degassed in vacuum (~0.095 MPa) for 2 h, so that gas and a small molecular compound in the prepolymer were removed. Then, 0.86 parts by mass of a hollow microsphere polymer having an average diameter of 40 μm were added. The hollow microsphere polymer was uniformly dispersed in the prepolymer by stirring, followed by degassing in vacuum (~0.0.095 MPa) for 2 h again. Then the mixture was cooled to 50° C. for later use.

At Step 2: a curing agent composition was formulated.

23.5 parts by mass of MOCA were heated to 115° C. to be completely melted into a clear and transparent liquid, and 10 parts by mass of aliphatic secondary amine terminated polyether SD2001 were added therein. The MOCA and the aliphatic secondary amine terminated polyether SD2001 were mixed uniformly by stirring to form a uniform transparent liquid for later use.

At Step 3: the curing agent composition was used to cure the prepolymer containing the hollow microsphere polymer.

The raw materials and amounts thereof are shown in Table 7 and Table 8, and the amounts of all materials are in parts by mass.

The prepolymer and the curing agent composition were mixed under high-speed shearing, and then cast into a cylindrical mould to form a castable having a thickness of 12 cm. The castable was gelled for 15 min at 70° C., then heated to 100° C. within 30 min, and cured for 16 h. After being cured, the castable was cooled to a room temperature automatically in an oven. The cured casting block was cut from top to bottom in sequence into sheets having a thickness of 2 mm. 60 sheets were obtained in total.

A Shore hardness, a density and a compression rate of the obtained polyurethane polishing layer were measured respectively according to the above-mentioned methods, and the results are shown in Table 9.

Examples 22-35

Through the same process as Example 21, polyurethane polishing layers having different effects may be obtained by selecting aliphatic secondary amine terminated polyethers having different trade-marks, prepolymers having different contents of unreacted —NCOs, hollow microsphere polymers having different average diameters, and different chain extension coefficients. The raw materials and amounts thereof are summarized in Table 1 and Table 2, and the amounts of all materials are in parts by mass. A hardness, a density and a compression rate of the polyurethane polishing layer prepared in each Example were measured according to the methods in Example 1, and the results are shown in Table 3.

Comparative Example 3

A commercially-available polishing pad extensively applied to copper manufacturing process in current advanced manufacturing process was purchased. The raw materials are summarized in Table 7. A hardness, a density and a compression rate of the polyurethane polishing layer in this Comparative Example were measured according to the methods in Example 21, and the results are summarized in Table 9.

Comparative Example 4

A preparation method of the polyurethane polishing layer in this Comparative Example is as follows.

At Step 1: an isocyanate-terminated polycarbamate prepolymer (hereinafter referred to as a prepolymer) was treated.

100 parts by mass of isocyanate-terminated prepolymer (comprising 8.75-9.05% of unreacted —NCO groups) obtained by a reaction of toluene diisocyanate and polytetrahydrofuran were heated to 80° C., and degassed in vacuum (~0.095 MPa) for 2 h, so that gas and a small molecular compound in the prepolymer were removed. Then, 0.86 parts by mass of a hollow microsphere polymer having an average diameter of 40 μm were added. The hollow microsphere polymer was uniformly dispersed in the prepolymer by stirring, followed by degassing in vacuum (~0.095 MPa) for 2 h again. Then the mixture was cooled to 50° C. for later use.

At Step 2: a curing agent was formulated.

23.5 parts by mass of MOCA were heated to 115° C. to be completely melted into a clear and transparent liquid for later use.

At Step 3: the curing agent was used to cure the prepolymer containing the hollow microsphere polymer.

The prepolymer and the curing agent were mixed under high-speed shearing, and then cast into a cylindrical mould to form a castable having a thickness of 12 cm. The castable was gelled for 15 min at 70° C., then heated to 100° C. within 30 min, and cured for 16 h. After being cured, the castable was cooled to a room temperature automatically in an oven. The cured casting block was cut from top to bottom in sequence into sheets having a thickness of 2 mm. 60 sheets were obtained in total.

The raw materials and amounts thereof are summarized in Table 7 and Table 8, and the amounts of all materials are in parts by mass. A hardness, a density and a compression rate of the polyurethane polishing layer prepared in this Comparative Example were measured, and the results are shown in Table 9.

TABLE 7

Components of polyurethane polishing layers in Examples 21-35 and Comparative Examples 3-4

| | Isocyanate-terminated prepolymers | | Curing agent systems | |
| --- | --- | --- | --- | --- |
| Examples | Adiprene ® | Unreacted -NCO (wt %) | Secondary amine terminated polyether Jeffamine ® | Aromatic bifunctional curing agent |
| 21 | L325 | 9.1 | SD2001 | MOCA |
| 22 | L325 | 9.1 | SD2001 | MOCA |
| 23 | L325 | 9.1 | SD2001 | MOCA |
| 24 | L325 | 9.1 | SD401 and SD2001 | MOCA |
| 25 | L325 | 9.1 | SD401 | MOCA |
| 26 | LF750D | 8.9 | SD401 | MOCA |

TABLE 7-continued

Components of polyurethane polishing layers in
Examples 21-35 and Comparative Examples 3-4

| | Isocyanate-terminated prepolymers | | Curing agent systems | |
|---|---|---|---|---|
| | | | Secondary amine | Aromatic |
| Examples | Adiprene ® | Unreacted - NCO (wt %) | terminated polyether Jeffamine ® | bifunctional curing agent |
| 27 | LF750D | 8.9 | HK511 | MOCA |
| 28 | LF750D | 8.9 | SD2001 | MOCA |
| 29 | LF750D | 8.9 | SD2001 and SD401 | MOCA |
| 30 | LF750D | 8.9 | SD2001 | MCDEA |
| 31 | LF750D L325 | 9.0 | SD401 | MCDEA |
| 32 | LF750D L325 | 9.0 | SD2001 | MCDEA |
| 33 | LF750D L325 | 9.0 | SD231 | MOCA |
| 34 | L325 | 9.1 | ST404 | MOCA |
| 35 | L325 | 9.1 | Compound A* | MOCA |
| Comparative Example 3 | L325 | 9.1 | — | MOCA |
| Comparative Example 4 | L325 | 9.1 | — | MOCA |

A molecular structure of the compound A is:

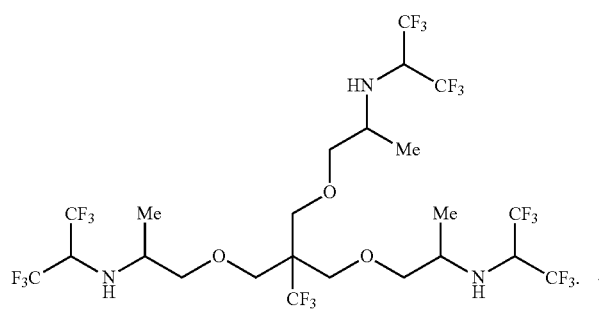

TABLE 8

The amounts of components of polyurethane polishing layers in
Examples 21-35 and Comparative Examples 3-4 (unit: parts by mass)

| | | Curing agents | | |
|---|---|---|---|---|
| | | Secondary amine terminated | Aromatic bifunctional | Microsphere Expancel |
| Examples | Prepolymer | polyether | curing agent | 20 μm | 40 μm |
| 21 | 100 | 10 | 23.5 | | 0.86 |
| 22 | 100 | 25 | 21.5 | | 1.03 |
| 23 | 100 | 40 | 19.5 | | 1.20 |
| 24 | 100 | 10* | 23.5 | | 1.74 |
| 25 | 100 | 20 | 21.5 | | 2.73 |
| 26 | 100 | 30 | 19.5 | | 6.02 |
| 27 | 100 | 7 | 26.0 | | 0.80 |
| 28 | 100 | 24 | 23.8 | | 0.89 |
| 29 | 100 | 70** | 17.5 | | 1.13 |
| 30 | 100 | 7 | 26.0 | 1.48 | |
| 31 | 100 | 23 | 23.8 | 1.65 | |
| 32 | 100 | 70 | 17.5 | 2.10 | |
| 33 | 100 | 40 | 23.5 | 1.12 | |
| 34 | 100 | 10 | 23.5 | | 0.86 |
| 35 | 100 | 10 | 23.5 | | 0.86 |
| Comparative Example 3 | — | — | — | — | — |
| Comparative Example 4 | 100 | — | 23.5 | | 0.86 |

*an amount ratio of SD401 to SD2001 is 1:1.
**an amount ratio of SD401 to SD2001 is 2:1.

Physical and chemical properties of the polyurethane polishing layers of the polishing pads in Examples 21-35 and Comparative Examples 3-4 are shown in Table 9.

TABLE 9

Physical and chemical properties of polyurethane polishing layers in
Examples 21-35 and Comparative Examples 3-4

| | Polyurethane polishing layers | | |
|---|---|---|---|
| Examples | Density (g/cm³) | Hardness (D) | Compression rate (%) |
| 21 | 1.004 | 68.4 | 0.42 |
| 22 | 0.989 | 61.2 | 0.66 |
| 23 | 0.994 | 54.7 | 0.72 |
| 24 | 0.902 | 68.1 | 0.82 |
| 25 | 0.779 | 55.2 | 1.51 |
| 26 | 0.600 | 46.6 | 4.73 |
| 27 | 1.023 | 70.3 | 0.41 |
| 28 | 1.015 | 58.4 | 0.73 |
| 29 | 0.992 | 45.8 | 4.52 |
| 30 | 1.002 | 57.5 | 2.79 |
| 31 | 0.983 | 68.4 | 1.46 |
| 32 | 1.011 | 46.3 | 3.83 |
| 33 | 1.100 | 69.8 | 0.55 |
| 34 | 1.005 | 68.9 | 0.41 |
| 35 | 1.002 | 67.6 | 0.40 |
| Comparative Example 3 | 1.003 | 66.7 | 1.61 |
| Comparative Example 4 | 1.042 | 67.5 | 0.63 |

By analyzing Tables 7-9, the following results may be obtained.

Since the reactivity of the secondary amine terminated polyether is close to that of the aromatic primary amine curing agent, a ratio of the secondary amine terminated polyether to the aromatic primary amine may be adjusted conveniently, and thus the hardness of the polishing pad may be adjusted within a large range, to obtain the polishing pads having different polishing effects. As can be seen from Examples 21-23 and 34-35 in Table 8, if a mass ratio of the secondary amine terminated polyether to the aromatic primary amine in the curing agent system is larger, the hardness of the polyurethane polishing layer is decreased and the compression rate is increased. By comparing Example 21 with Comparative Examples 3-4, it can be seen that the hardness of the polishing layer is increased, the compression rate is decreased thereby, the physical and chemical properties of the polishing pad are enhanced, and the stability and wear resistance are better, by adding MOCA. Furthermore, the crosslinking property is enhanced, the physical and chemical properties are further improved, and the grinding property is also improved, with the addition of the curing agent system of the secondary amine terminated polyether and MOCA.

Testing Example 6: Evaluation of Density Uniformity of Polishing Layers

Experimental method 1: density uniformity of sheets obtained by cutting a polyurethane casting block was tested. The sheets were taken from the polishing layer sheets obtained in Example 21 and Comparative Example 4. There were 60 sheets in each of Example 21 and Comparative Example 4. One sheet was sampled from every 5 sheets from bottom to top, and they were numbered as 1 to 10. The Shore density was tested for each sampled sheet, and the results are summarized in FIG. 6.

Figure 6:
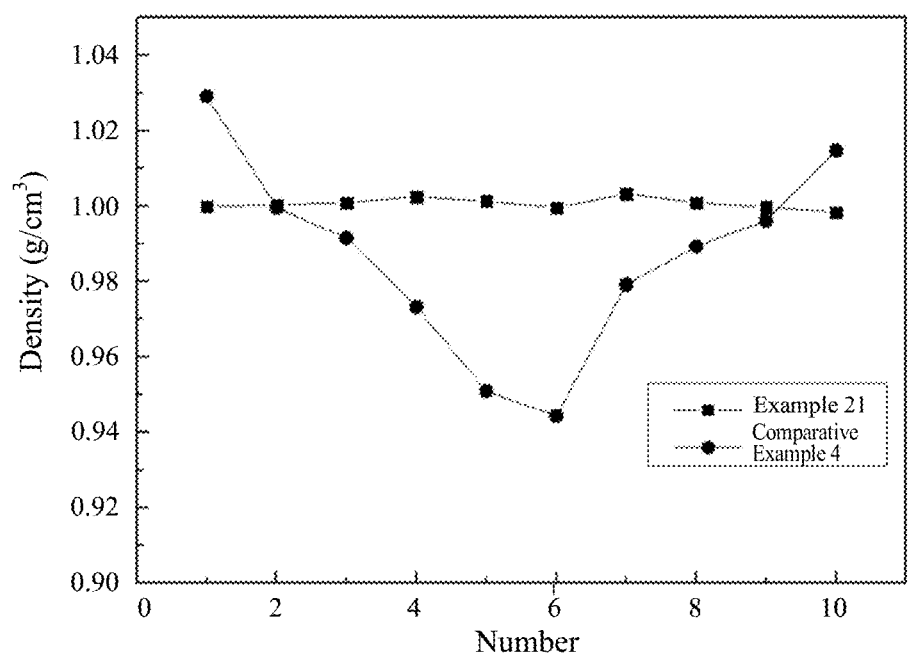
FIG. 6 is a diagram for comparing density distribution of the polishing layers prepared in Example 21 and Comparative Example 3, in which the polishing layers are taken from different positions of a cured casting block.

As can be seen from FIG. 6, a density distribution of the polyurethane casting block represented by respective polishing layer sheets in Comparative Example 4 has a "smiling curve" in which the middle part is low and the two ends are high.

In Example 21, by using the bicomponent curing system comprising the secondary amine terminated polyether and the aromatic bifunctional compound which have similar reactivity, and by means of an effect of reducing a use temperature of the curing agent system by the secondary amine terminated polyether, the heat generated during a casting process is reduced, the uniformity after the castable is cured is well controlled, and the polishing sheets taken from different parts of the casting block show a significantly improved uniformity. Compared with the experimental result of Example 1 shown in FIG. 2, it may be seen that the density of the polishing layers obtained from different parts of the cured casting block in Example 21 is more uniform. As can be seen, by using the secondary amine terminated polyether, the casting block that is cured more uniformly in a whole is obtained.

Experimental method 2: density uniformity of the polyurethane sheet from a middle part of the polyurethane casting block was tested from a center to an edge: the sheets that were middlemost in the 60 polishing layer sheets in Example 1 and Comparative Example 2 respectively, namely, the sheets numbered as 29, were taken. Along a radius direction, from a center to an edge, 10 small round sheets having a diameter of 4 cm were respectively taken and numbered as 1-10 in sequence. The Shore density of each small round sheet was tested, and the results are summarized in FIG. 7.

Figure 7:
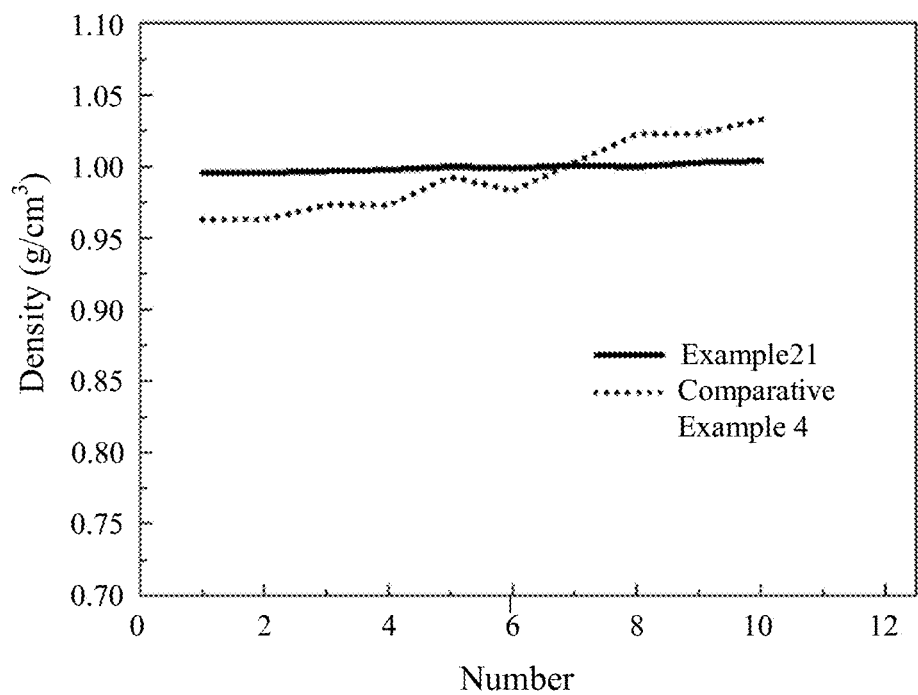
FIG. 7 is a diagram for comparing radial density distribution of a single polishing layer which is respectively prepared in Example 21 and Comparative Example 3, in which the single polishing layer is taken from a central portion of a cured casting block.

In a radial density distribution diagram of the polishing sheet taken from the middle part of the polyurethane casting block shown in FIG. 7, the density of the sheet in Comparative Example 4 becomes lower when closing to the center and becomes higher when closing to the edge. However, the density uniformity in Example 21 is significantly superior to Comparative Example 4. Again, a reason for such an improvement in the density uniformity is also attributed to the better bicomponent curing agent system of the disclosure.

Therefore, by using the curing system of the secondary amine terminated polyether and the aromatic bifunctional compound provided by the disclosure, the quality controllability in preparation of the polishing layer may be effectively improved. The polishing layer with a more uniform quality can be obtained, and the density uniformity of each polishing layer from the center to the edge can further be obtained. The quality uniformity of the polishing pad is effectively improved, and the defect rate of a semiconductor product can be reduced, such that the planarization quality of a semiconductor is improved overall.

Testing Example 7: Evaluation of Polishing Properties of Polishing Pads

Polishing pads were prepared with polishing layers from a same part in Examples 21-23 and a conventional polishing layer in Comparative Example 3.

The polishing properties of the prepared polishing pads in Examples 21-23 and Comparative Example 3 were evaluated by testing on a machine. The testing conditions were as follows.

A testing machine table was AMAT Refelxion (Modify 5 Zone).

A polishing solution was ANJI 3060 (diluted at 1:9, $H_2O_2\%=1\%$), with a flow rate of 250 mL/min.

A trimming plate was Saesol Disk 6045C4, P/C downforce 5 lbf, Head & Platen RPM: 93/87.

A wafer was a Pattern wafer: Semitech 754, Cu Blanket wafer Pre Thickness 10 KA.

Evaluation of Removal Rates of Polishing Pads

The polishing pads prepared with the polishing layers in Examples 21-23 and Comparative Example 3 were used to grind a wafer on an AMAT Refelxion testing machine, and a removal rate and a defect rate in a life cycle of the polishing pad were recorded during grinding. The results are summarized in Table 10 and FIGS. 7-8.

TABLE 10

Comparison of the removal rates and the nonuniformity NU values of the polishing pads in Examples 21-23, 34-35 and Comparative Example 3

| No. | Example 21 | Example 22 | Example 23 | Example 34 | Example 35 | Comparative Example 3 |
| --- | --- | --- | --- | --- | --- | --- |
| Average removal rate (Å/min) | 8746 | 8614 | 8098 | 8693 | 8721 | 8363 |
| Nonuniformity NU (%) | 3.22 | 4.18 | 3.62 | 3.43 | 3.12 | 4.31 |
| Striation | ○ | ○ | ○ | ○ | x | ○○○ | x—None, ○—Less than 2 lines, ○○○—More than 6 lines

FIG. 7 shows a diagram of removal rates of polishing pads in Examples 21-23 and a conventional polishing pad in Comparative Example 3 tested at different positions of a wafer under a pressure of 2.5 psi.

Figure 8:
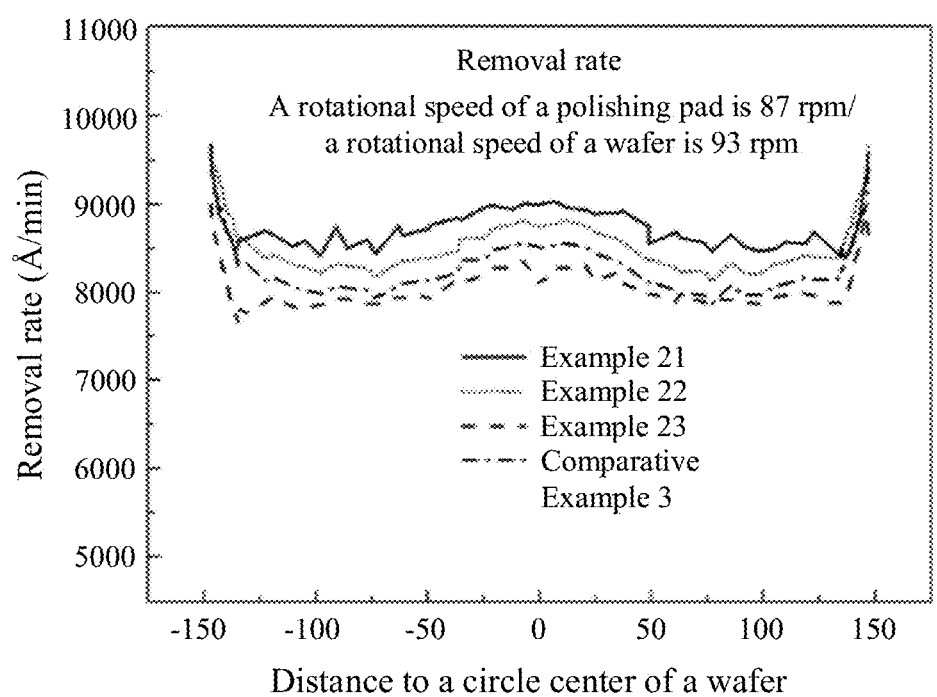
FIG. 8 is a diagram for comparing removal rates for polishing a semiconductor wafer by using the polishing pads prepared with the polishing layers of Examples 21-23 and Comparative Example 3.
Figure 9:
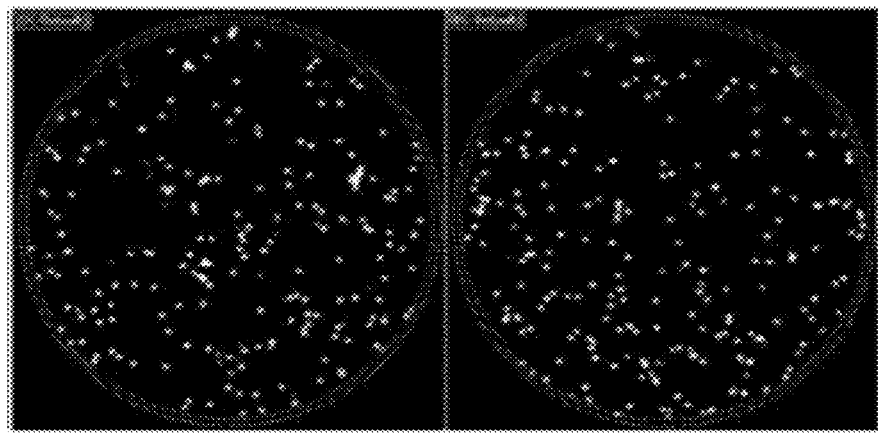
FIG. 9 is a diagram for comparing wafer defect rates of the polished semiconductor wafers which are polished by the polishing pads prepared with the polishing layers in Examples 21-23 and Comparative Example 3.
Figure 9:
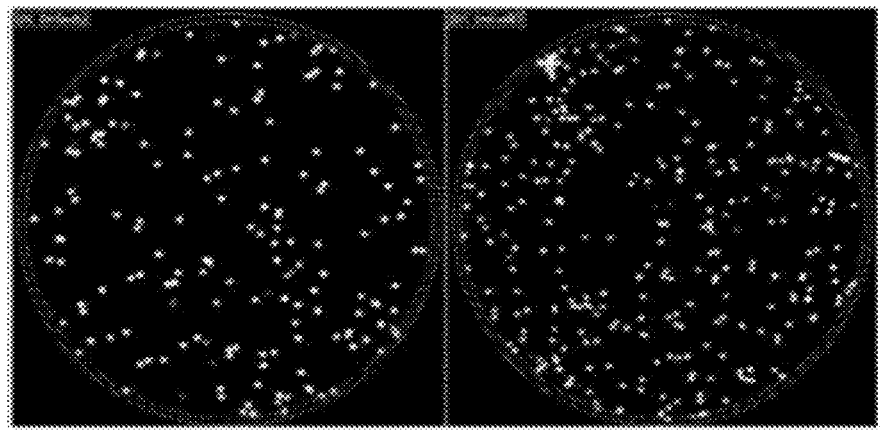

FIG. 8 shows scanning electron microscope images of defects on the base material after polishing by the polishing pads in Examples 21-23 and the conventional polishing pad in Comparative Example 3.

Referring to Table 10 and FIGS. 7-8, the polishing pads in Examples 21 and 22 have a higher polishing rate than the polishing pad in Comparative Example 3. However, the polishing pad in Example 23 has a low removal rate, which may attribute to a low hardness. Therefore, if a polishing layer with a high hardness is required, the parts by mass of the secondary amine terminated polyether in the curing agent system should not be too high.

Further, the polishing pads in Examples 21-23 and 34-35 have a rate uniformity similar to that of the conventional polishing pad in Comparative Example 3. From the center to the edge of the wafer, there is no large rate fluctuation, and the NU values are smaller than 5%, which indicates that the curing agent system used for preparing the polishing layer according to the disclosure may effectively balance a removal rate and a defect rate, and obtain the satisfactory removal rate and defect rate. For example, the removal rates in Examples 21-22 and 34-35 are obviously improved, and the defect rates are not significantly increased. As a result, a good balance between the removal rate and the defect rate is achieved. Although the removal rate in Example 23 is decreased to some extent (a decrease of about 2.9% compared with Comparative Example 1), the number of defects is improved apparently (a decrease of about 15% compared with Comparative Example 1, decreasing from 359 to 305).

Additionally, when the trifunctional perfluorinated secondary amine is used in the curing agent system in Example 35, the polishing pad has a nearly perfect appearance and has no striation. However, the striation in Comparative Example 3 is a serious problem, which may be an important reason to cause a high defect rate on a surface of the base material after polishing, and also make the NU value high. By using the secondary amine terminated component in the curing agent system in Examples 21-23 and 34, the presence of striation of the polishing pad is suppressed to some extent.

Comparative Examples 5-10: Influence of Hardness of Endpoint Detection Window on Number of Defects Polishing layers having the endpoint detection window of Example 22 and Comparative Examples 5-10 were prepared, by using the formula of the polishing layer in Example 22 and using different polyurethane materials. During preparing the polishing layers, the hardness of the endpoint detection window was controlled. Further, the polishing pads were prepared according to the above Testing Example 7, and the number of defects of the polishing pads was detected. The hardness of the polishing layers, the hardness of the endpoint detection windows, a hardness difference between the polishing layer and the endpoint detection window, and the number of defects in Example 22 and Comparative Examples 5-10 are summarized in the following Table 11.

TABLE 11

Influence of the hardness difference between the polishing layer and the endpoint detection window on the number of defects

| | Hardness of polishing layer ($D_L$) | Hardness of endpoint detection window ($D_W$) | Hardness difference ($D_L - D_W$) | Number of defects | Appearance of the Window |
|---|---|---|---|---|---|
| Example 22 | 61.2 | 63.7 | +2.5 | 259 | Flat |
| Comparative Example 5 | 61.2 | 50.5 | −10.7 | 252 | Dishing |
| Comparative Example 6 | 61.2 | 53.7 | −7.5 | 260 | Dishing |
| Comparative Example 7 | 61.2 | 56.1 | −5.1 | 255 | Slightly dishing |
| Comparative Example 8 | 61.2 | 67.1 | +5.9 | 337 | Flat |
| Comparative Example 9 | 61.2 | 70.6 | +9.4 | 409 | Flat |
| Comparative Example 10 | 61.2 | 74.3 | +13.1 | 593 | Flat |

As can be seen from the above Table, when the hardness of the endpoint detection window is lower than that of the polishing layer and the hardness difference is greater than 5 (Comparative Examples 5-7), the appearance of the window is dishing, which is disadvantageous to the wear resistance of the polishing pad. When the hardness of the endpoint detection window is higher than that of the polishing layer and the hardness difference is greater than 5 (Comparative Examples 8-10), the number of defects tends to increase apparently with an increase of the hardness difference. Therefore, the difference between the hardness of the endpoint detection window and the hardness of the polishing layer should be controlled within ±5.

Although the disclosure has been illustrated and described with specific Examples, it should be appreciated that many other changes and modifications may be made without departing from a spirit and a scope of the disclosure. Therefore, this means that the appended claims include all these changes and modifications belonging to the scope of the disclosure.

The invention claimed is:

1. A polyurethane polishing layer for preparing a chemical-mechanical polishing pad, wherein the polyurethane polishing layer comprises a reaction product produced by a reaction of a multi-component raw material combination, and the raw material combination comprises an isocyanate-terminated prepolymer, a hollow microsphere polymer and a curing agent composition, based on a total weight of the curing agent composition, the curing agent composition comprises:
5-55 wt % of a polyether diamine curing agent, wherein a number-average molecular weight of the polyether diamine curing agent is 1000-5000;
0.1-8 wt % of a polyamine curing agent, wherein a molecular structure of the polyamine curing agent at least comprises three primary amine groups or at least comprises three secondary amine groups, and a number-average molecular weight of the polyamine curing agent is 250-6000; and
40-90 wt % of an aromatic bifunctional curing agent;
wherein:
the polyurethane polishing layer has a density of 0.6-1.1 g/cm$^3$, a Shore D hardness of 45-70 D and an elongation at break of 50-200%; and
a coefficient of thermal expansion of the polyurethane polishing layer is 100-140 ppm/° C., wherein the coefficient of thermal expansion is measured according to ASTM D1903-1996.

2. The polyurethane polishing layer of claim 1, wherein the isocyanate-terminated prepolymer comprises 8.5-9.5 wt % of unreacted —NCO groups.

3. The polyurethane polishing layer of claim 1, wherein a stoichiometric ratio of unreacted —NCO groups in the isocyanate-terminated prepolymer to active hydrogen-containing groups in the curing agent composition is 1.05-1.20.

4. The polyurethane polishing layer of claim 1, wherein the polyamine curing agent is selected from a group consisting of aliphatic polyamines, aromatic polyamines and a mixture thereof, wherein a number-average molecular weight of the aliphatic polyamine is 2000-6000, and a number-average molecular weight of the aromatic polyamine is 250-2000.

5. The polyurethane polishing layer of claim 1, wherein a hydrolytic stability of the polyurethane polishing layer when being hydrolyzed at a pH value of 2-5 for 80 h is smaller than 1.5%, and the hydrolytic stability of the polyurethane polishing layer when being hydrolyzed at a pH value of 9-12 for 80 h is smaller than 1.5%.

6. The polyurethane polishing layer of claim 1, wherein a hydrolytic stability of the polyurethane polishing layer when being hydrolyzed at a pH value of 2-5 for 80 h is smaller than 0.65%, and the hydrolytic stability of the polyurethane polishing layer when being hydrolyzed at a pH value of 9-12 for 80 h is smaller than 0.80%.

7. The polyurethane polishing layer of claim 1, wherein the polyurethane polishing layer comprises at least one endpoint detection area and/or a groove for receiving a polishing solution.

8. A method for preparing the polyurethane polishing layer of claim 1, comprising:
   mixing an isocyanate-terminated prepolymer in a liquid state with a hollow microsphere polymer, and degassing in vacuum to obtain a first product;
   mixing the first product with a curing agent composition at 50° C. under high-speed shearing to obtain a second product; and
   controlling a temperature of the second product, so that an initial reaction temperature for the first product and the curing agent composition is ≤70° C. and a reaction peak temperature is ≤80° C.

9. A chemical-mechanical polishing pad having the polyurethane polishing layer of claim 1.

10. A chemical-mechanical polishing pad, comprising a polyurethane polishing layer, wherein the polyurethane polishing layer is a reaction product of a raw material combination, and the raw material combination comprises an isocyanate-terminated prepolymer, a hollow microsphere polymer and a curing agent composition,
   wherein the curing agent composition comprises: a secondary amine terminated polyether curing agent and an aromatic bifunctional curing agent, and a mass ratio of the secondary amine terminated polyether curing agent to the aromatic bifunctional curing agent is 1:4-4:1; and
   the isocyanate-terminated prepolymer comprises 5.5-9.5 wt % of unreacted —NCO groups,
   wherein the secondary amine terminated polyether curing agent comprises at least one compound selected from a group consisting of compounds represented by a general formula I and a general formula II:

wherein:
   in the general formula I, $R_1$ is a C1-C8 fluorine-containing alkyl, each of $R_2$, $R_3$, $R_4$ and $R_5$ independently is H or a C1-C8 alkyl or fluorine-containing alkyl, and x and y respectively are 0 or a positive integer, with a premise of x+y≤12; and
   in the general formula II, $R_1$ is a C1-C8 fluorine-containing alkyl, each of $R_2$, $R_3$, $R_4$ and $R_5$ independently is H or a C1-C8 alkyl or fluorine-containing alkyl, a=b=c=1, and x, y, m, n, o and p respectively are 0 or a positive integer, with a premise of x+y+m+n+o+p≤12.

11. The chemical-mechanical polishing pad of claim 10, wherein a number-average molecular weight of the secondary amine terminated polyether curing agent is 250-6000.

12. The chemical-mechanical polishing pad of claim 10, wherein the polyurethane polishing layer has a density of 0.6-1.1 g/cm³, and a Shore D hardness of 45-75 D.

13. The chemical-mechanical polishing pad of claim 10, wherein the polishing pad further has an endpoint detection window, and an absolute value of a difference between a Shore D hardness of the endpoint detection window and a Shore D hardness of the polyurethane polishing layer is ≤5.

14. A method for planarizing at least one base material selected from a semiconductor base material, an optical base material and a magnetic base material, comprising the following steps:
   providing the at least one base material selected from the semiconductor base material, the optical base material and the magnetic base material, the at least one base material having a surface;
   providing the chemical-mechanical polishing pad of claim 10; and
   dynamically polishing the surface of the base material by using the chemical-mechanical polishing pad.

15. The chemical-mechanical polishing pad of claim 10, wherein the secondary amine terminated polyether curing agent is a compound with a formula A, general formula I general formula II

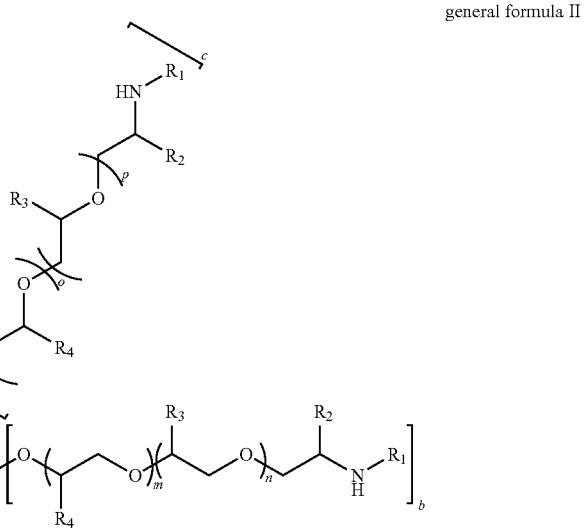

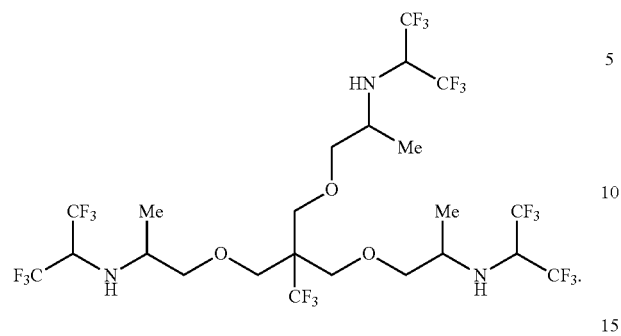
(A)
* * * * *